(12) United States Patent
Hosotani

(10) Patent No.: US 6,670,660 B2
(45) Date of Patent: Dec. 30, 2003

(54) SEMICONDUCTOR MEMORY DEVICE UTILIZING TUNNEL MAGNETO RESISTIVE EFFECTS AND METHOD FOR MANUFACTURING THE SAME

(75) Inventor: Keiji Hosotani, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/961,326

(22) Filed: Sep. 25, 2001

(65) Prior Publication Data

US 2002/0037595 A1 Mar. 28, 2002

(30) Foreign Application Priority Data

Sep. 28, 2000 (JP) .......................................... 2000-296082

(51) Int. Cl.$^7$ ........................... H01L 29/76; H01L 29/94
(52) U.S. Cl. ........................................ 257/295; 257/536
(58) Field of Search ............................ 438/3, 171, 210; 257/295, 536, 537, 516; 365/158, 171, 173

(56) References Cited

U.S. PATENT DOCUMENTS

| | | | | |
|---|---|---|---|---|
| 5,883,828 A | * | 3/1999 | Cuchiaro et al. | ............ 257/295 |
| 5,894,447 A | | 4/1999 | Takashima | .................. 365/158 |
| 5,936,882 A | * | 8/1999 | Dunn | .......................... 365/157 |
| 6,048,739 A | * | 4/2000 | Hurst et al. | .................. 438/131 |
| 6,072,718 A | | 6/2000 | Abraham et al. | |
| 6,169,688 B1 | | 1/2001 | Noguchi | ..................... 365/171 |
| 6,278,631 B1 | * | 8/2001 | Naji | ............................. 365/158 |
| 6,365,419 B1 | * | 4/2002 | Durlam et al. | ............... 257/421 |
| 2001/0035545 A1 | | 11/2001 | Schuster-Woldan et al. | |

FOREIGN PATENT DOCUMENTS

| | | |
|---|---|---|
| JP | 2001-217398 | 8/2001 |
| JP | 2001-357666 | 12/2001 |
| JP | 2002-157874 | 5/2002 |

OTHER PUBLICATIONS

Roy Scheuerlein, et al., "A 10ns Read and Write Non–Volatile Memory Array Using a Magnetic Tunnel Junction and FET Switch in each Cell", ISSCC 2000/Session 7/TD: Emerging Memory & Device Technologies/Paper TA 7.2, 2000 IEEE International Solid–State Circuits Conference, Feb. 8, 2000, pp. 128–133.

Peter K. Naji, et al., "A 256kb 3.0V 1T1MTJ Nonvolatile Magnetoresistive RAM", ISSCC 2001/Session 7/Technology Directions: Advanced Technologies/7.6, Technology Digest, 2001 IEEE International Solid–State Circuits Conference, 11 pages.

(List continued on next page.)

Primary Examiner—Wael Faberyl
Assistant Examiner—Hoai Pham
(74) Attorney, Agent, or Firm—Oblon, Spivak, McClelland, Maier & Neustadt, P.C.

(57) ABSTRACT

There is provided, according to one embodiment of this invention, a semiconductor memory device comprising first memory elements to store a first state or a second state according to a change in resistance value, each of the first memory elements comprising one terminal and the other terminal, the first memory elements arranged parallel with each other, a first wiring connected with the one terminal of each of the first memory elements, and a second wiring formed in parallel with the first wiring and connected with the other terminal of each of the first memory elements, wherein the first state or the second state stored in one of selected from the first memory elements is read out by delivering an electric current from one of the first and second wirings via the one of selected from the first memory elements to the other of the first and second wirings.

5 Claims, 17 Drawing Sheets

OTHER PUBLICATIONS

Dietmar GOGL, et al, MRAM Configuration, Pub.: US 2002/0039308 A1, Pub. Date: Apr. 4, 2002, U.S. Patent Application Publication, Pages: 6.

U.S. patent application Ser. No. 09/961,326, filed Sep. 25, 2001, pending.

U.S. patent application Ser. No. 10/107,310, filed Mar. 28, 2002, pending.

U.S. patent application Ser. No. 09/961,326, Hosotani, filed Sep. 25, 2001.

U.S. patent application Ser. No. 10/369,886, Iwata et al., filed Feb. 21, 2003.

U.S. patent application Ser. No. 09/987,980, filed Nov. 16, 2001, unknown.

U.S. patent application Ser. No. 09/961,326, filed Sep. 25, 2001, pending.

U.S. patent application Ser. No. 10/180,517, filed Jun. 27, 2002, pending.

U.S. patent application Ser. No. 09/961,326, filed Sep. 25, 2001, pending.

U.S. patent application Ser. No. 10/306,404, filed Nov. 29, 2002, pending.

U.S. patent application Ser. No. 10/305,988, filed Nov. 29, 2002, pending.

U.S. patent application Ser. No. 09/961,326, filed Sep. 25, 2001, pending.

U.S. patent application Ser. No. 10/180,024, filed Jun. 27, 2002, pending.

* cited by examiner

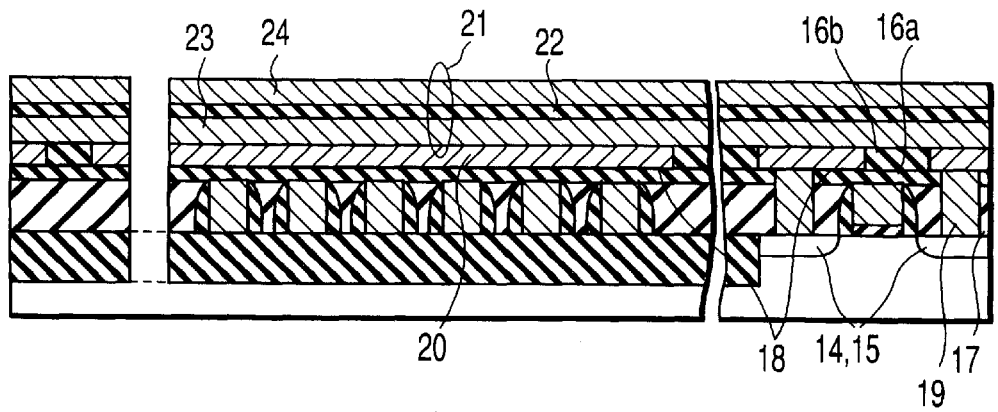
F I G. 18
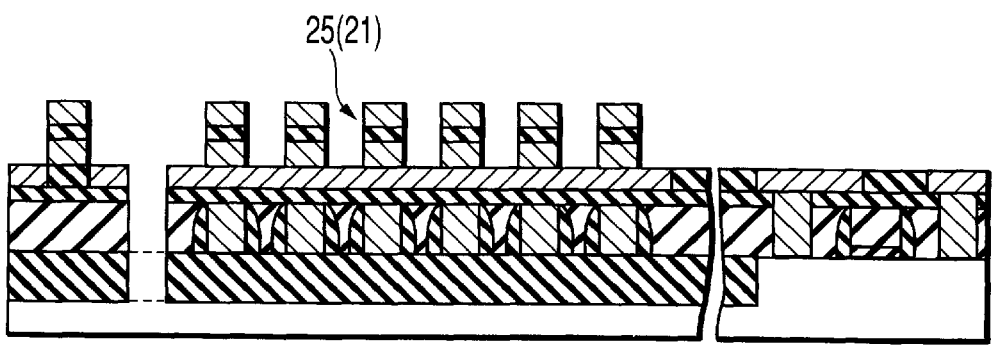
F I G. 19
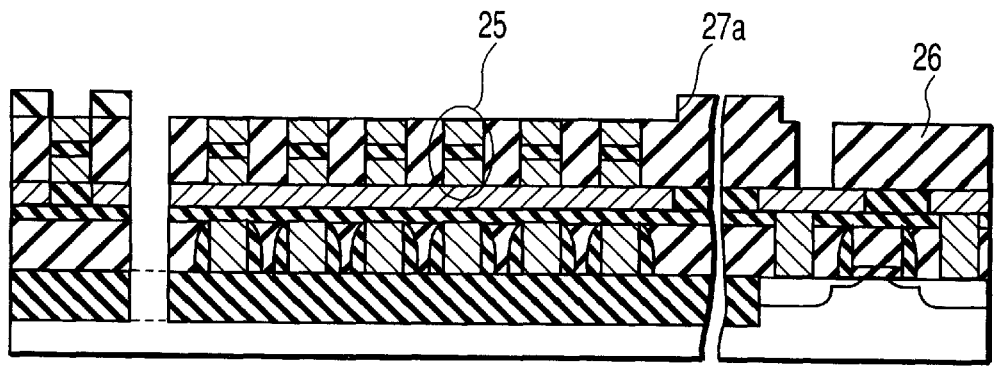
F I G. 20

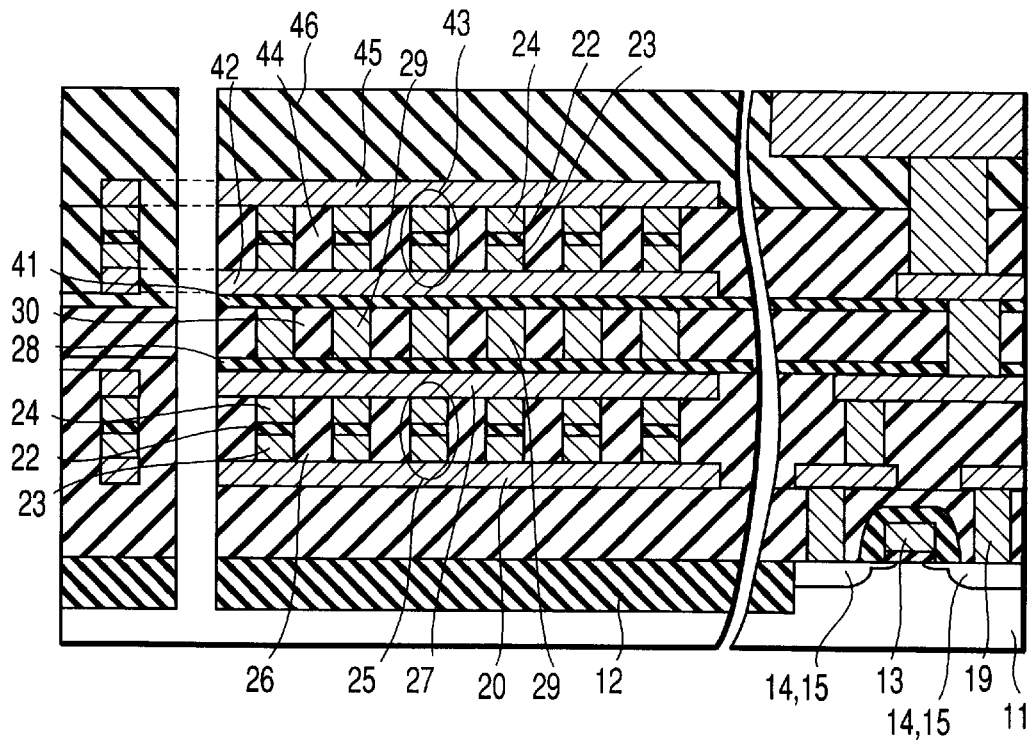
F I G. 30A
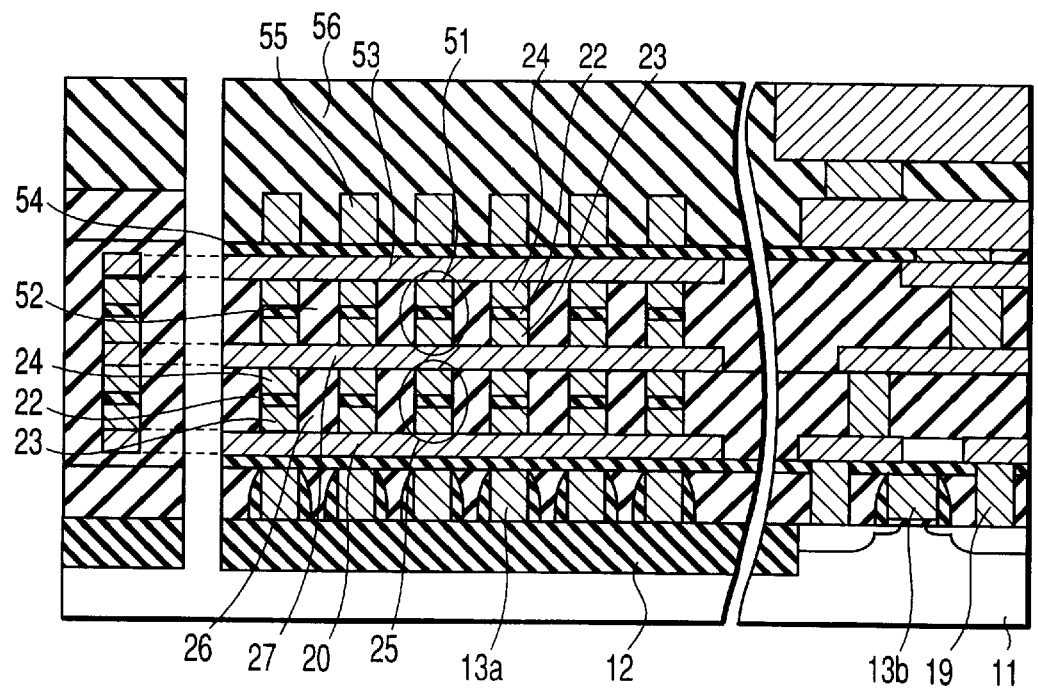
F I G. 31

SEMICONDUCTOR MEMORY DEVICE UTILIZING TUNNEL MAGNETO RESISTIVE EFFECTS AND METHOD FOR MANUFACTURING THE SAME

CROSS-REFERENCE TO RELATED APPLICATIONS

This application is based upon and claims the benefit of priority from the prior Japanese Patent Application No. 2000-296082, filed Sep. 28, 2000, the entire contents of which are incorporated by reference.

BACKGROUND OF THE INVENTION

1. Field of the Invention

This invention relates to a semiconductor device and the manufacturing method thereof, and in particular, to magnetic random access memory (MRAM) wherein a mechanism for storing information "1" and "0" by taking advantage of tunnel magneto resistive (TMR) effects is utilized as a memory cell, and also to the manufacturing method thereof.

2. Description of the Related Art

In recent years, there has been proposed a MRAM utilizing, as an information memory element, a tunneling magneto resistive element (hereinafter, referred to simply as a TMR element).

This TMR element is formed of a structure wherein a thin tunneling insulating film is sandwiched between a couple of magnetic films. Further, this TMR element is enabled to take two states, i.e. a state wherein the directions of the spins of this couple of magnetic films are the same and parallel with each other, and another state wherein the directions of the spins of these magnetic films are counter-parallel with each other.

When the directions of the spins of these magnetic films are the same and parallel with each other, the tunneling resistance of current flowing through the tunneling insulating film becomes the lowest, thereby enabling the TMR element to memorize "1" under this condition. On the other hand, when the directions of the spins of these magnetic films are counter-parallel with each other, the tunneling resistance of current flowing through the tunneling insulating film becomes the highest, thereby enabling the TMR element to memorize "0" under this condition.

Next, the principle of operation of this TMR element will be briefly explained. When it is desired to write the "1" and "0" data in this TMR element, a couple of word line and data line are selected, and an electric current is delivered to them to generate a magnetic field. As a result, a magnetic field is applied to a TMR element of the selected cell located at the cross-point between the word line and the data line, so that the "1" and "0" data are enabled to be written therein as the magnetic field exceeds over the reversing threshold value of the spin of this TMR element. On the other hand, if the "1" and "0" data written in this TMR element are to be read out, an electric current is delivered to read out a difference in resistance of the tunneling insulating film between different TMR elements, thereby determining if the data is "1" or "0".

The MRAM memory utilizing this conventional TMR element is accompanied with the following problems. Namely, since this conventional TMR element is constructed such that an electric current is delivered through a tunneling insulating film, a fluctuation in resistance between different TMR elements is caused to increase logarithmically as the film thickness of the tunneling insulation film is increased. Since the film thickness of the tunneling insulating film of the TMR element that has been reported to date varies within the range of about several to several tens angstroms, the resistance between the TMR elements will be scattered, depending on the scattering in thickness of the tunneling insulating film.

Therefore, if the MRAM is desired to be formed through the application of a differential sense amplifier system where data is designed to be read through a comparison of the resistance value of the tunneling insulating film with a reference value as employed in the DRAM, the variation of resistance $\Delta R$ to be determined by the magneto resistive ratio (hereinafter, referred to as MR ratio) due to the TMR is required to be larger than the scattering of the reference resistance or than the scattering of resistance between the TMR elements. However, since the MR ratio reported to date is at most 50% or so, the variation of resistance $\Delta R$ cannot be made sufficiently large.

In order to overcome the aforementioned problems, the following system, for example, has been conventionally adopted.

FIG. 34 shows a cross-sectional view of a semiconductor memory device according to the prior art. FIG. 35 shows an equivalent circuit of the semi-conductor memory device according to the prior art.

As shown in FIG. 34, a plurality of TMR elements 71 disposed inside a memory cell are respectively connected with a pair of switching transistors 72, thus constituting one unit 73. If data is to be read out, the switching transistor 72 located only at the cell selected is turned ON, thereby permitting an electric current to flow from data lines 74 and 75 to the ground. However, if it is tried, with the employment of this structure, to compare the resistance value of the TMR element 71 with that of the reference cell, not only the scattering of tunneling resistance of the TMR element 71 but also the scattering of channel resistance of the switching transistor 72 is required to be taken into account for the comparison. Therefore, it becomes impossible to secure a sufficient MR ratio, thereby making it difficult to employ the differential sense amplifier system.

Therefore, conventionally proposed has been a structure wherein a pair of the units 73 each constituted by the TMR element 71 and the switching transistor 72 are combined into a single memory cell 76 as shown in FIG. 35. In this case, the circuit thereof is constructed in such a manner that the opposite data of "1" and "0" are always written in these two TMR elements 71. As a result, the variation of resistance $\Delta R$ to be determined by the MR ratio can be doubled, thereby making it possible to perform the read/write operation of an MRAM memory cell, while enabling a sufficient margin to be secured for determining the "1" and "0" data.

However, this conventional structure is accompanied with a problem that since the units 73 are employed for constituting a single memory cell 76, four elements, i.e. two TMR elements 71 +two of MOS transistors 72 are required to be included in each bit of the memory cell 76, this conventional structure is disadvantageous in increasing the area of the memory cell 76. Additionally, even though it is certainly possible to double the margin for determining the "1" and "0" data, it can not necessarily be said that a sufficient margin can be secured for reading data.

BRIEF SUMMARY OF THE INVENTION

According to a first aspect of this invention, there is provided a semiconductor memory device, which comprises: first memory elements to store a first state or a second state according to a change in resistance value, each of the first memory elements comprising one terminal and the other terminal, the first memory elements arranged parallel with each other; a first wiring connected with the one terminal of each of the first memory elements; and a second wiring formed in parallel with the first wiring and connected with the other terminal of each of the first memory elements; wherein the first state or the second state stored in one of selected from the first memory elements is read out by delivering an electric current from one of the first and second wirings via the one of selected from the first memory elements to the other of the first and second wirings.

BRIEF DESCRIPTION OF THE SEVERAL VIEWS OF THE DRAWING

FIG. 18 is a cross-sectional view illustrating a manufacturing step of the semiconductor memory device subsequent to the step shown in FIG. 17 according to a second embodiment of this invention;

FIG. 19 is a cross-sectional view illustrating a manufacturing step of the semiconductor memory device subsequent to the step shown in FIG. 18 according to a second embodiment of this invention;

FIG. 20 is a cross-sectional view illustrating a manufacturing step of the semiconductor memory device subsequent to the step shown in FIG. 19 according to a second embodiment of this invention;

FIG. 30A is a cross-sectional view illustrating the semiconductor memory device according to a fourth embodiment of this invention;

FIG. 31 is a cross-sectional view illustrating the semiconductor memory device according to a fifth embodiment of this invention;

DETAILED DESCRIPTION OF THE INVENTION

Next, various embodiments of this invention will be explained with reference to the drawings.

First Embodiment

Figure 1:
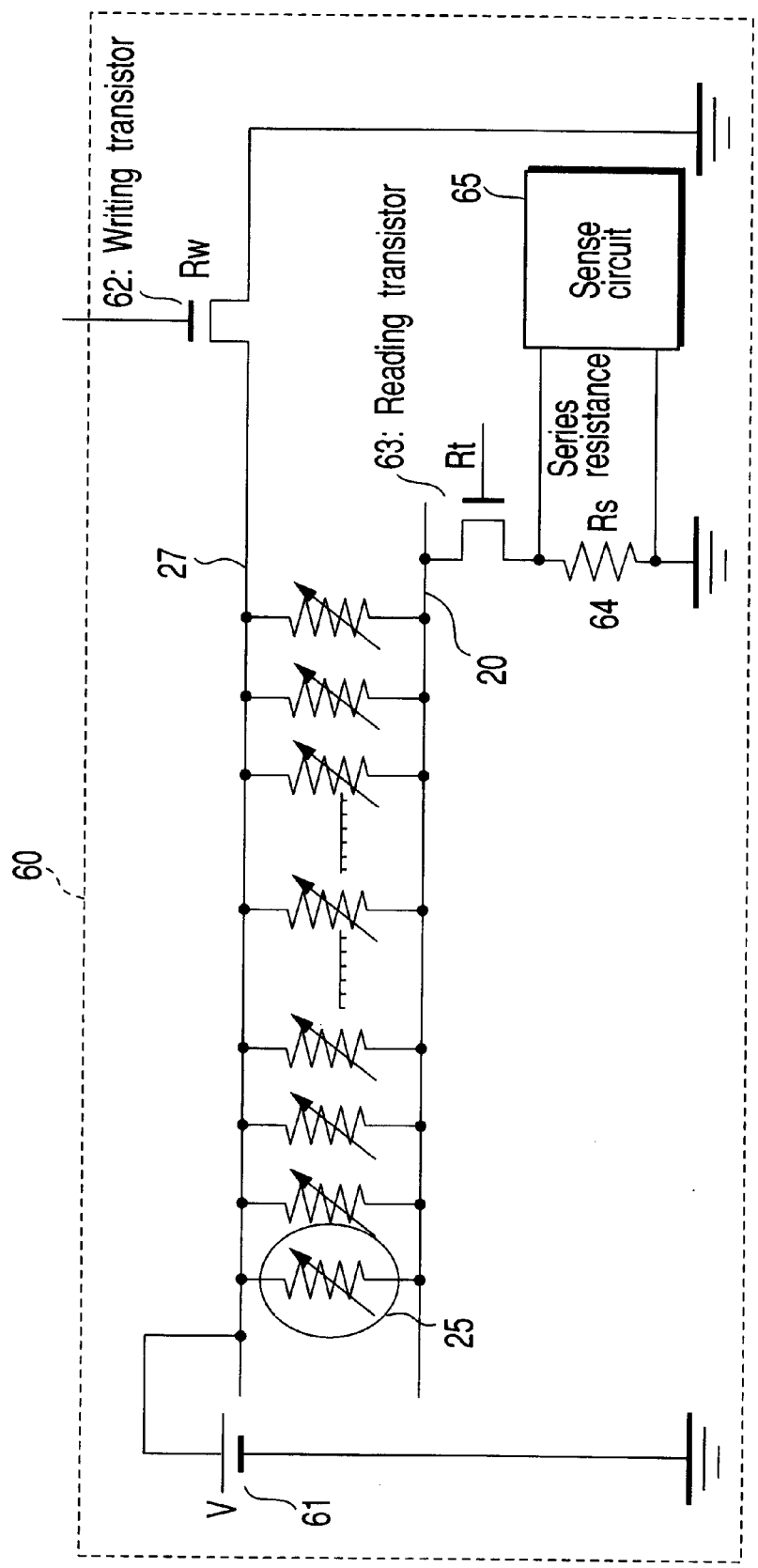
FIG. 1 is an equivalent circuit of the semiconductor memory device according to a first embodiment of this invention.
Figure 2:
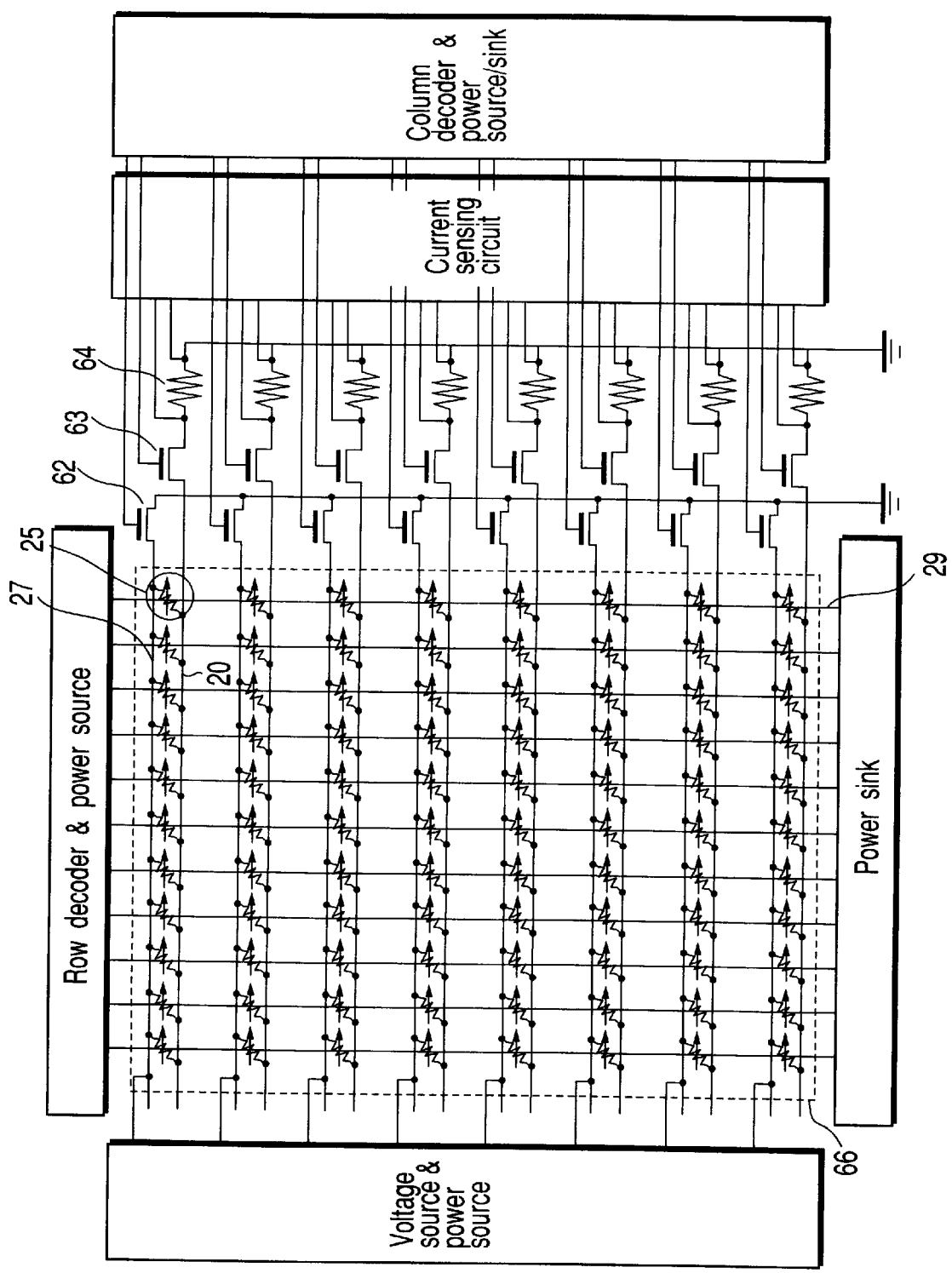
FIG. 2 is a diagram showing the memory cell array of the semiconductor memory device according to a first embodiment of this invention.

FIG. 1 shows an equivalent circuit of the semiconductor memory device according to a first embodiment of this invention, and FIG. 2 shows a block diagram of the memory cell array wherein the equivalent circuit shown in FIG. 1 is arranged one after another in parallel with each other. Next, the structure of the equivalent circuit of the semiconductor memory device according to this invention will be explained.

As shown in FIG. 1, the equivalent circuit 60 of a semiconductor memory device according to a first embodiment is constituted by a plurality of tunneling magneto resistive effect element of TMR (Tunneling Magneto Resistive) type (hereinafter referred to as TMR element) 25 which are arranged parallel with each other, an upper data transfer line 27, a lower data transfer line 20, a constant-voltage generating circuit 61, a writing transistor 62, a reading transistor 63, a series resistor 64, and a sense circuit 65.

In this case, the upper data transfer line 27 is electrically connected with an upper electrode of the TMR element 25, while the lower data transfer line 20 is electrically connected with a lower electrode of the TMR element 25. The constant-voltage generating circuit 61 is connected with the upper data transfer line 27 or with the lower data transfer line 20, thereby enabling a constant voltage to be applied to the upper data transfer line 27 or the lower data transfer line 20. The writing transistor 62 is interposed between the upper data transfer line 27 or the lower data transfer line 20 and the ground terminal. The reading transistor 63 is interposed also between the upper data transfer line 27 or the lower data transfer line 20 and the ground terminal. The series resistor 64 is inserted between the reading transistor 63 and the ground terminal. The sense circuit 65 is juxtaposed with the series resistor 64.

As shown in FIG. 2, the memory cell array 66 of the semiconductor memory device of this invention is constituted by a plurality of equivalent circuits 60 each shown in FIG. 1 and arranged parallel with each other. On this TMR element 25, a plurality of word lines 29 for generating a cell-writing magnetic field are arranged parallel with each other. These word lines 29 are orthogonally intersected with the data transfer lines 20 and 27. As a result, a matrix is formed by a combination of these data transfer lines 20 and 27 and these word lines 29, thereby forming an MRAM (Magnetic Random Access Memory) type memory cell array 66.

Figure 3:
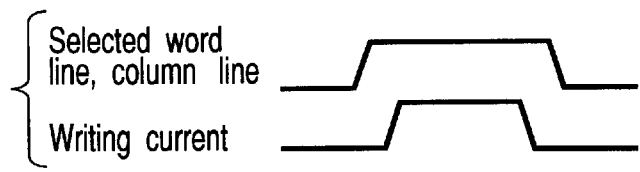
FIG. 3 is a diagram illustrating the writing operation of the semiconductor memory device according to a first embodiment of this invention.
Figure 4:
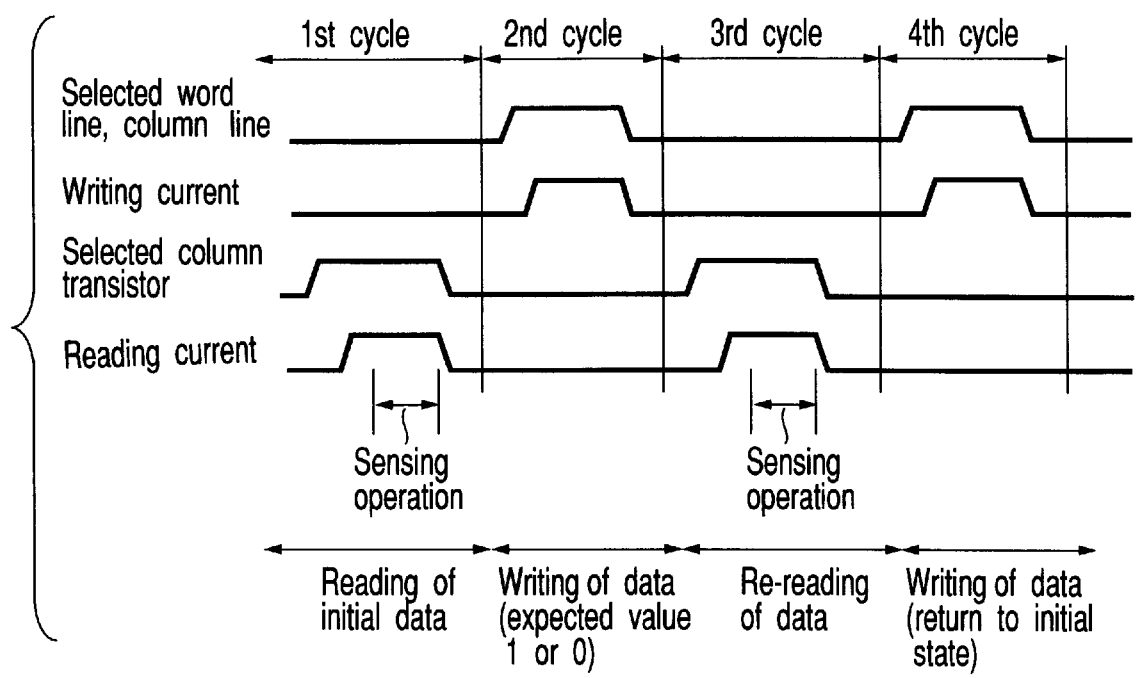
FIG. 4 is a diagram illustrating the reading operation of the semiconductor memory device according to a first embodiment of this invention.

FIG. 3 illustrates the writing operation of the semiconductor memory device according to the first embodiment of this invention, and FIG. 4 illustrates the reading operation of the semiconductor memory device according to the first embodiment of this r invention. Next, the reading/writing operation of the semiconductor memory device according to the first embodiment will be explained. Incidentally, the TMR element to be employed herein is constituted by two magnetic bodies with a tunneling insulating film being interposed therebetween, one of these magnetic bodies being an antiferromagnetic layer where the direction of spin is pinned, and the other being a soft magnetic layer where the reversing threshold value of spin is relatively low.

As shown in FIGS. 2 and 3, if a writing operation is to be performed, a desired word line 29 of the row decoder is selected at first, and then, an electric current is delivered to the selected word line 29 to thereby generate a magnetic field. Then, the writing transistor 62 of the upper data transfer line 27 of the column decoder which is desired to be selected is turned ON, thereby delivering an electric current to the upper data transfer line 27 to generate a magnetic field. When a composite magnetic field consisting of two magnetic fields differing in direction exceeds over the reversing threshold value of the soft magnetic layer constituting the TMR element 25 at a cross point of this couple of magnetic fields differing in direction, the writing operation into the TMR element 25 can be executed.

As shown in FIGS. 2 and 4, if a reading operation is to be performed, a reading transistor 63 of the same column as that of the cell selected is turned ON in the first cycle, thereby delivering a reading electric current to the TMR element 25 connected parallel with one another and formed on the lower data transferring line 20, thereby permitting this reading electric current to be stored in the sense circuit 65. Subsequently, the reading transistor 63 is turned OFF, and the reading electric current is also turned OFF.

Then, in the second cycle, a writing electric current for writing the expected value "1" or "0" is delivered to the word line 29 as well as to the upper data transfer line 27 of a cell having the same address. Subsequently, this writing electric current is turned OFF. Then, in the third cycle, a reading transistor 63 of the same column as that of the cell selected is again turned ON, thereby delivering a reading electric current to the TMR element 25 connected in parallel with one another and formed on the lower data transferring line 20, thereby permitting this reading electric current to be stored in the sense circuit 65. Thereafter, the reading electric current that has been stored in the sense circuit 65 at the first cycle is compared with the reading electric current that has been stored in the sense circuit 65 at the third cycle. In the case where a writing operation of the expected value "1" has been executed in the writing operation, if there is no substantial change in reading electric current between the first and third cycles, the value that has been originally written therein would be identified as "1", whereas if there is a substantial increase in reading electric current between the first and third cycles, the value that has been originally written therein would be identified as "0". On the other hand, in the case where a writing operation of the expected value "0" has been executed in the writing operation, if there is not any substantial change in reading electric current between the first and third cycles, the value that has been originally written therein would be identified as "0", whereas if there is a substantial increase in reading electric current between the first and third cycles, the value that has been originally written therein would be identified as "1". It is possible in this manner to read out the data that has been written in the cell. Thereafter, in the fourth cycle, an electric current is delivered to the word line 29 as well as to the upper data transfer line 27 so as to enable the same data as that of the initial state to be written again, thus finishing the reading operation.

Figure 5:
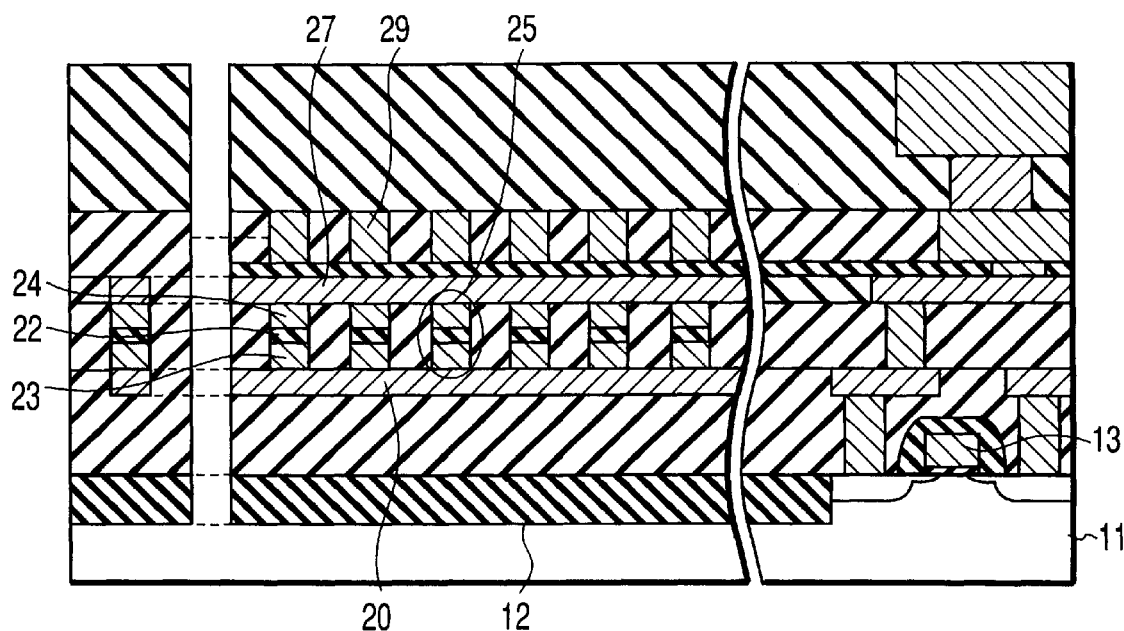
FIG. 5 is a cross-sectional view illustrating the semiconductor memory device according to a first embodiment of this invention.

FIG. 5 shows a cross-sectional view illustrating the semiconductor memory device according to the first embodiment of this invention. As shown in FIG. 5, the TMR element 25 in this semiconductor memory device according to the first embodiment is constituted by a first magnetic body 23, a second magnetic body 24, and an insulating layer 22 which is formed of a non-magnetic body and sandwiched between the first and second magnetic bodies 23 and 24. Further, a plurality of TMR elements 25 are arranged parallel with each other. The first magnetic bodies 23 constituting these TMR elements 25 are connected with each other through a first wiring (lower data transfer line) 20, while the second magnetic bodies 24 constituting these TMR elements 25 are connected with each other through a second wiring (upper data transfer line) 27. Additionally, a third wiring (word line) 29 is disposed over an extension line which connects a junction between the memory elements 25 and the first wiring 20 with a junction between the memory elements 25 and the second wiring 27. In this case, the first wiring 20 is disposed parallel with the second wiring 27, and these first and second wirings 20 and 27 are orthogonally intersected with the third wiring 29. Further, these first and second wirings 20 and 27 and the plural memory elements 25 are all arranged ladder-like.

Although not shown in FIG. 5, one of these first and second wirings 20 and 27 is connected to a constant voltage generating circuit, and the other is connected via a resistor to a grounded circuit, both ends of the resistor being connected to a sense circuit (see FIGS. 1 and 2). In this case, the constant voltage generating circuit and the grounded circuit should preferably be connected with the terminal portions of these first and second wirings 20 and 27, respectively. It would be possible in this manner to suppress the influence of the parasitic resistance of the wirings and hence to allow an electric current to uniformly flow throughout the memory cell array.

FIGS. 6 to 11 respectively show a cross-sectional view illustrating a manufacturing step of the semiconductor memory device according to the first embodiment of this invention. FIG. 12 shows a top plan view of various mask patterns to be employed in each of the embodiments. Next, the method of manufacturing a semiconductor memory device according to this first embodiment will be explained.

Figure 6:
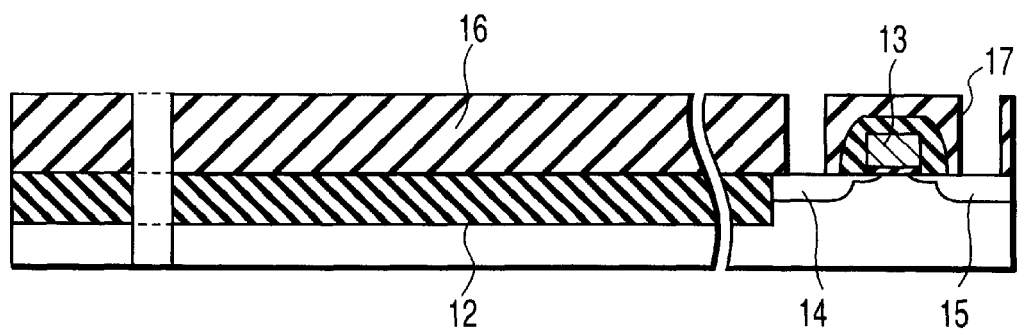
FIG. 6 is a cross-sectional view illustrating a manufacturing step of the semiconductor memory device according to a first embodiment of this invention.

First of all, as shown in FIG. 6, an oxide film (not shown) having a thickness of 30 to 40 angstroms for example and an SiN film (not shown) having a thickness of 2000 angstroms for example are successively deposited on a p-type silicon substrate 11. Then, by making use of lithography, a groove is formed in a memory cell region, and then, by means of LPCVD (Low Pressure Chemical Vapor Deposition) method, the groove is buried with an $SiO_2$ film. Then, by means of CMP (Chemical Mechanical Polishing) method, the $SiO_2$ film is flattened to an element isolation region 12. Thereafter, by making use of an ordinary MOS process, the gate electrode 13 and source/drain regions 14 and 15 of MOSFET are formed in the peripheral circuit region of cell, thereby forming a p-type or n-type MOSFET. Next, a first interlayer insulating film 16 is deposited on the MOSFET as well as on the element isolation region 12, and then, flattened by means of the CMP method. Then, a first contact hole 17 is formed in the source/drain regions 14 and 15 provided in the peripheral circuit region.

Figure 7:
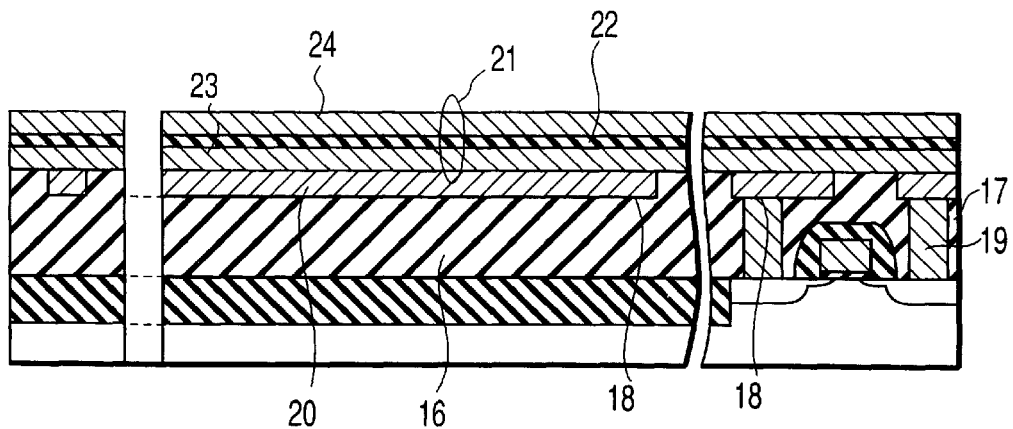
FIG. 7 is a cross-sectional view illustrating a manufacturing step of the semiconductor memory device subsequent to the step shown in FIG. 6 according to a first embodiment of this invention.

Then, as shown in FIG. 7, by means of an RIE (Reactive Ion Etching) method using the lower data transfer line mask of (1-B) shown in FIG. 12, the first interlayer insulating film 16 is etched away to a depth of about 2000 angstroms for example to thereby form a groove 18 for forming a lower data transfer line. Then, by means of a sputtering method, a barrier metal film (not shown) consisting of a TiN film for example is formed on the groove 18 for forming a lower data transfer line and the first contact hole 17. Then, by means of a blanket tungsten CVD (Chemical Vapor Deposition) method, a tungsten layer is formed on the barrier metal film. Then, the barrier metal film and the tungsten layer are flattened by means of CMP method until the surface of the first interlayer insulating film 16 is exposed to concurrently form a contact 19 and a lower data transfer line 20. Then, by means of a sputtering method, a laminate film 21 for forming TMR elements is formed on the surfaces of the lower data transfer line 20 and the first interlayer insulating film 16.

In this case, the laminate film 21 for forming TMR elements is constructed such that an insulating layer 22 formed of an $Al_2O_3$ film having a thickness of 10 to 20 angstroms is employed as a tunnel barrier, and a first magnetic layer 23 and a second magnetic layer 24 are superimposed on the top and bottom sides of this insulating layer 22, respectively. The details on this TMR element will be discussed hereinafter. Next, by means of a CVD method, a DLC (Diamond-Like Carbon) film (not shown) is deposited on the laminate film 21 to be employed for forming TMR elements.

Figure 8:
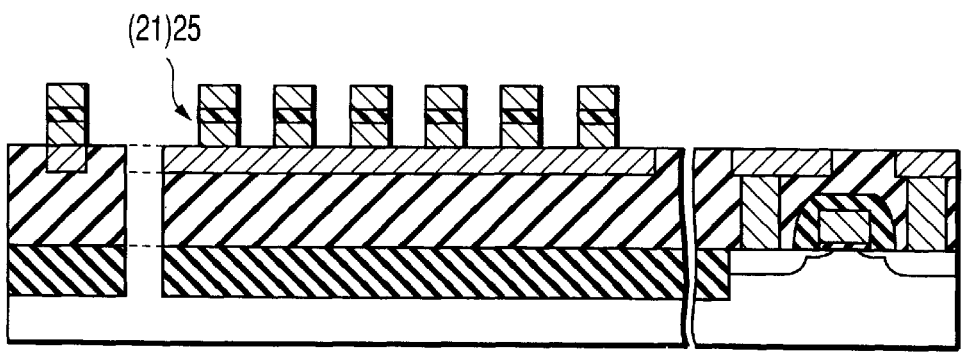
FIG. 8 is a cross-sectional view illustrating a manufacturing step of the semiconductor memory device subsequent to the step shown in FIG. 7 according to a first embodiment of this invention.

Then, as shown in FIG. 8, a resist film (not shown) is formed on the DLC film, and by making use of the TMR mask of (1-C) shown in FIG. 12, the resist film is etched to form a resist pattern. The resultant resist pattern is then employed for forming a DLC film pattern. Then, by making use of this DLC film pattern as a mask, the laminate film 21 for forming TMR elements is selectively etched by means of an ion milling method to form a laminate film pattern, thus forming a plurality of TMR elements.

Figure 9:
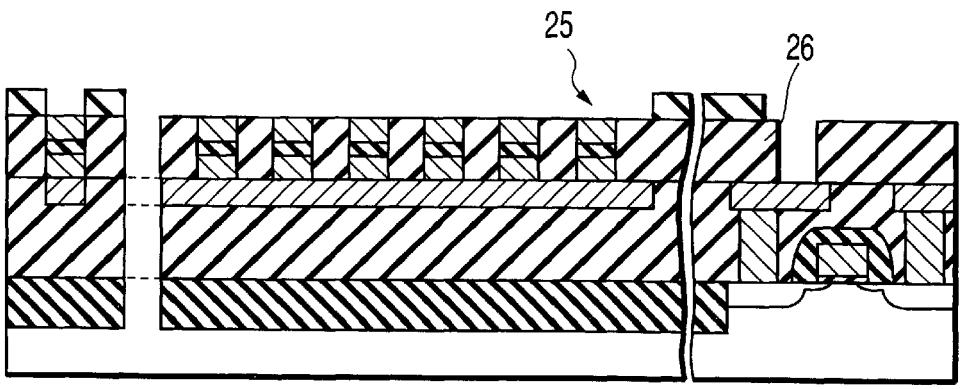
FIG. 9 is a cross-sectional view illustrating a manufacturing step of the semiconductor memory device subsequent to the step shown in FIG. 8 according to a first embodiment of this invention.

Then, as shown in FIG. 9, a second interlayer insulating film 26 is deposited on the surfaces of the TMR elements and of the lower data transfer line 20, the second interlayer insulating film 26 thus deposited being subsequently flattened by means of CMP method until the surface of the TMR elements is exposed. As a result, the regions between a plurality of TMR elements 25 are filled with this second interlayer insulating film 26.

Figure 10:
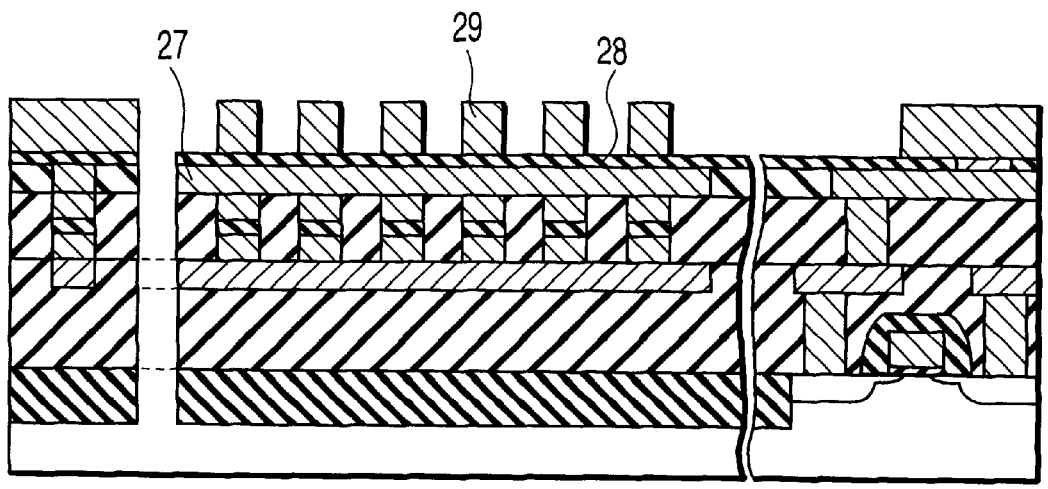
FIG. 10 is a cross-sectional view illustrating a manufacturing step of the semiconductor memory device subsequent to the step shown in FIG. 9 according to a first embodiment of this invention.

Then, as shown in FIG. 10, by means of sputtering method, a metal for forming an upper data transfer line is formed on the surfaces of the second interlayer insulating film 26 and of the TMR elements 25. Subsequently, by making use of the upper data transfer line mask of (1-D) shown in FIG. 12, the resultant metal layer is etched to form a pattern thereof, thus forming an upper data transfer line 27. Then, a first dielectric film 28 having a thickness of several tens to several hundreds angstroms is formed on the surface of the upper data transfer line 27. Additionally, an Al—Cu film is deposited on the surface of this first dielectric film 28 by means of sputtering method. In this case, Al may be replaced by Al—Cu, Cu or W. Although there is not any particular limitation with respect to the thickness of the Al—Cu film, it is preferable to confine the thickness of the Al—Cu film to about 3000 angstroms or less so as to confine the aspect of the wiring to 3 or so, provided that the minimum design rule is of the generation of 0.1 μm. Next, a resist film (not shown) is formed on this Al—Cu film, and by making use of the word line mask of (1-E) shown in FIG. 12, the resist film is etched to form a pattern thereof. The resultant resist pattern is then employed for performing the patterning of the Al—Cu film, thus forming a plurality of word lines 29.

Figure 11:
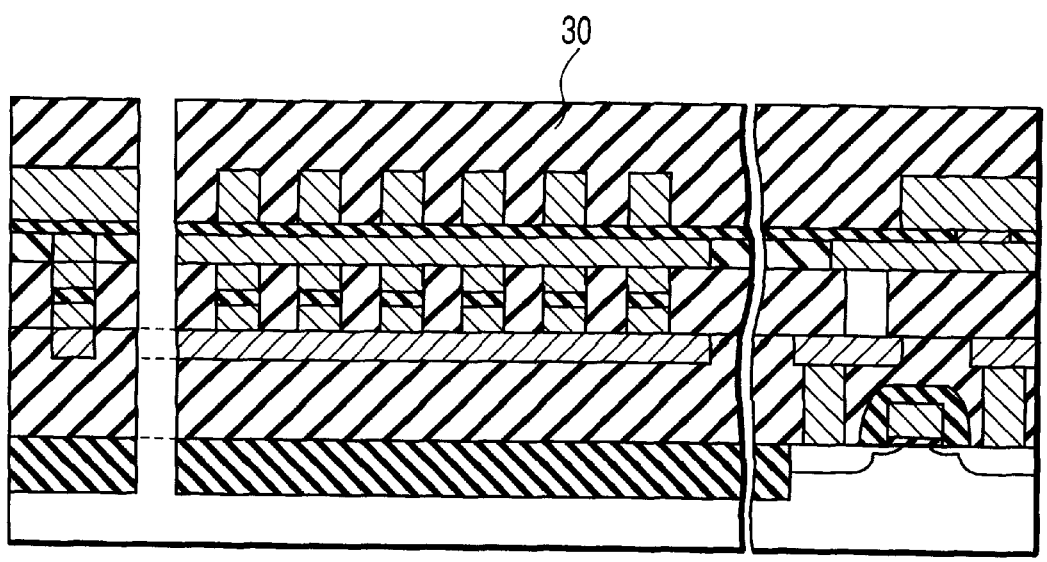
FIG. 11 is a cross-sectional view illustrating a manufacturing step of the semiconductor memory device subsequent to the step shown in FIG. 10 according to a first embodiment of this invention.
Figure 12:
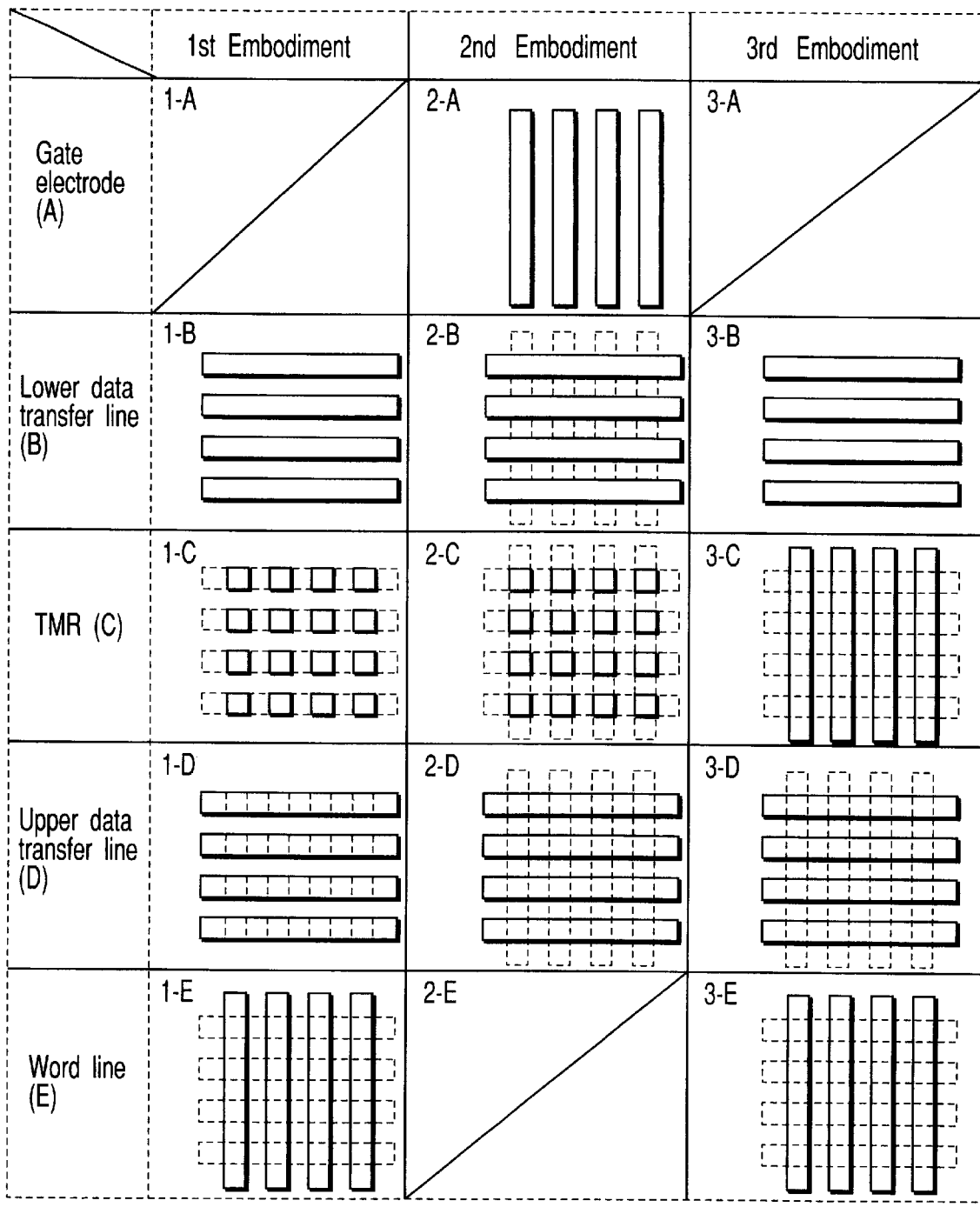
FIG. 12 is a top plan view illustrating various mask patterns to be employed in a first to third embodiments of this invention.

Then, as shown in FIG. 11, a third interlayer insulating film 30 is deposited on the surfaces of the word line 29 and on the first dielectric film 28, the third interlayer insulating film 30 thus deposited being subsequently flattened by means of CMP method or resist etch-back method. Subsequently, by undergoing a multi-layer wiring process, a memory cell of MRAM as shown in FIG. 5 can be accomplished.

FIG. 13A through FIG. 13D illustrate the structure of the TMR element employed in the semiconductor memory device of this invention.

Figure 13A:
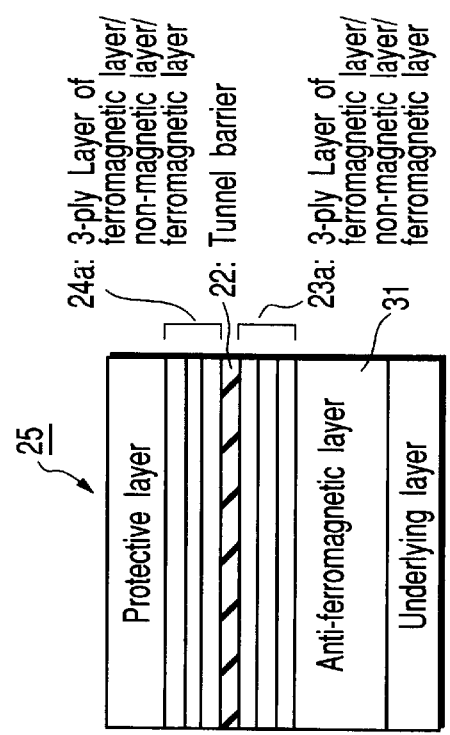
FIGS. 13A to 13D are cross-sectional views illustrating various structures of TMR element to be employed in the semiconductor memory device of this invention.

As shown in FIG. 13A, the TMR element 25 is constructed such that the insulating layer 22 is employed as a tunnel barrier, and the first ferromagnetic layer 23 and the second ferromagnetic layer 24 are superimposed on the top and bottom sides of this insulating layer 22, respectively. In this case, the first ferromagnetic layer 23 functions as a magnetization fixing layer, and the second ferromagnetic layer 24 functions as a magnetic recording layer. Further, both of these first and second ferromagnetic layers 23 and 24 have a film surface exhibiting a uniaxial anisotropy. Furthermore, the second ferromagnetic layer 24 functioning as a magnetization fixing layer is provided with a unidirectional anisotropy.

The film thickness of these first and second ferromagnetic layers 23 and 24 may be in the range of about 0.1 to 100 $\mu$m. However, for the purpose of preventing these first and second ferromagnetic layers 23 and 24 from being turned into super paramagnetism, the film thickness thereof should preferably be 0.4 $\mu$m or more. Although there is not any particular limitation with respect to the thickness of the insulating film 22, the thickness of the insulating film 22 should preferably be as thin as possible. For example, for the convenience of manufacture, the thickness of the insulating film 22 should preferably be 10 $\mu$m or less.

As for the materials for these first and second ferromagnetic layers 23 and 24, there is not any particular limitation, and therefore, it is possible to employ a metal such as Fe, Co, Ni or an alloy thereof; oxides such as $CrO_2$, $RXMnO_{3-y}$ (R: rare earth element; X: Ca, Ba or Sr); and Heusler's alloy such as NiMnSb, PtMnSb, etc. As long as ferromagnetism can be secured, these first and second ferromagnetic layers 23 and 24 may more or less contain a non-magnetic element such as Ag, Cu, Au, Al, Mg, Si, Bi, Ta, B, C, O, N, Pd, Pt, Zr, Ir, W, Mo and Nb. The first ferromagnetic layer 23 to be employed as a magnetization fixing layer should preferably be additionally attached in advance with an antiferromagnetic film 31 formed of Fe—Mn, Pt—Mn, Pt—Cr—Mn, Ni—Mn, Ir—Mn, NiO, $Fe_2O_3$, etc.

As for the insulating film 22, it is possible to employ various kinds of dielectric body such as $Al_2O_3$, $SiO_2$, MgO, AlN, $Bi_2O_3$, $MgF_2$, $CaF_2$, $SrTiO_2$, $AlLaO_3$, etc. This insulating film 22 may not be badly affected by the inclusion therein of oxygen, nitrogen, or fluorine defects.

Figure 13B:
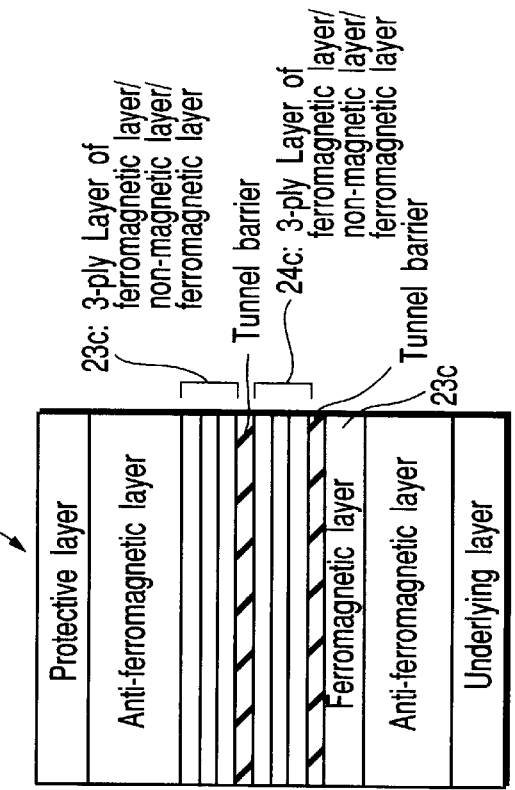

A laminate film consisting of a ferromagnetic layer and a non-magnetic layer may be substituted for the aforementioned first ferromagnetic layer 23. For example, as shown in FIG. 13B, a first 3-ply film 23a consisting of a ferromagnetic layer/a non-magnetic layer/a ferromagnetic layer may be employed for the first ferromagnetic layer 23. In this case, it is preferable that an antiferromagnetic interaction is effected between these magnetic layers through the non-magnetic layer. Namely, the method of unidirectionally fixing the magnetic layer should preferably be performed by providing an antiferromagnetic film 31 in contact with a laminate film such as Co(Co—Fe)/Ru/Co(Co—Fe), Co(Co—Fe)/Ir/Co(Co—Fe), etc. According to this structure, the magnetization of the first 3-ply film 23a functioning as a magnetization fixing layer can be hardly influenced by the magnetic field of electric current, and the antiferromagnetic film 31 can be strongly adhered to the laminate film.

Likewise, a laminate film consisting of a ferromagnetic layer and a non-magnetic layer may be substituted for the aforementioned second ferromagnetic layer 24. For example, a 2-ply layer consisting of a soft ferromagnetic layer/a ferromagnetic layer may be substituted for the second ferromagnetic layer 24. Alternatively, as shown in FIG. 13B, a second 3-ply film 24a consisting of a ferromagnetic layer/a soft magnetic layer/a ferromagnetic layer may be employed for the second ferromagnetic layer 24. In this case, if an antiferromagnetic interaction is effected between these magnetic layers through the non-magnetic layer, since the magnetic flux is closed at the second 3-ply film 24a, any increase of switching magnetic fields due to magnetic poles can be suppressed. Namely, there will be obtained a preferable effect that even if the width of a memory cell is decreased to a submicron or less, the power consumption for the magnetic field of the electric current can be prevented from increasing due to the effect of the anti-magnetic field. If this structure is to be employed, the magnetic layer which is disposed closer to the wiring for magnetic field of electric current should preferably be constituted by a layer which is softer than the ferroelectric layer formed of a 3-ply film consisting of a ferroelectric layer/a non-magnetic layer/a ferromagnetic layer. Furthermore, in the same manner as described above, a 2-ply layer consisting of a soft ferromagnetic layer/a ferromagnetic layer or a 3-ply film consisting of a ferromagnetic layer/a soft magnetic layer/a ferromagnetic layer may be laminated on the softer layer.

Figure 13C:
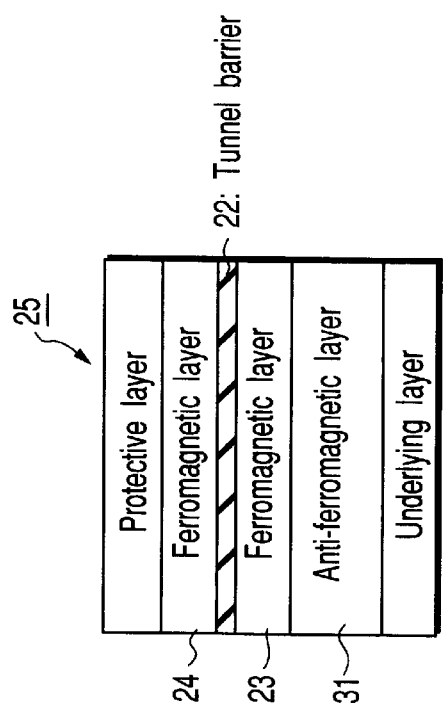
Figure 13D:
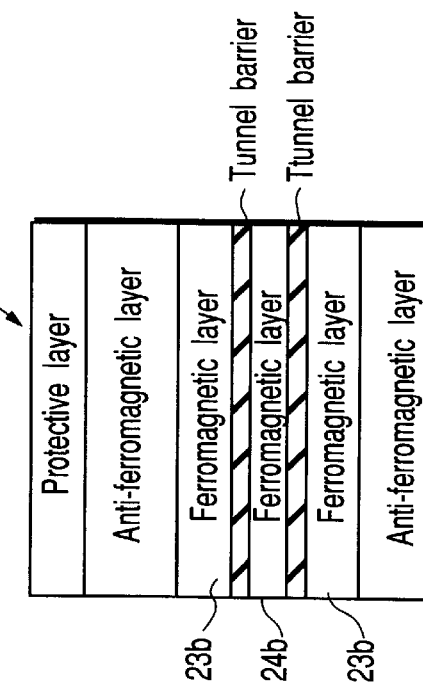

Further, as shown in FIGS. 13C and 13D, it is also possible to employ a TMR element 25 where the tunnel barrier is formed into a 2-ply structure. The TMR element 25 shown in FIGS. 13C and 13D is constructed such that the ferromagnetic layers 23b and 23c function as a magnetization fixing layer, while the ferromagnetic layers 24b and 24c function as a magnetic recording layer.

Figure 14:
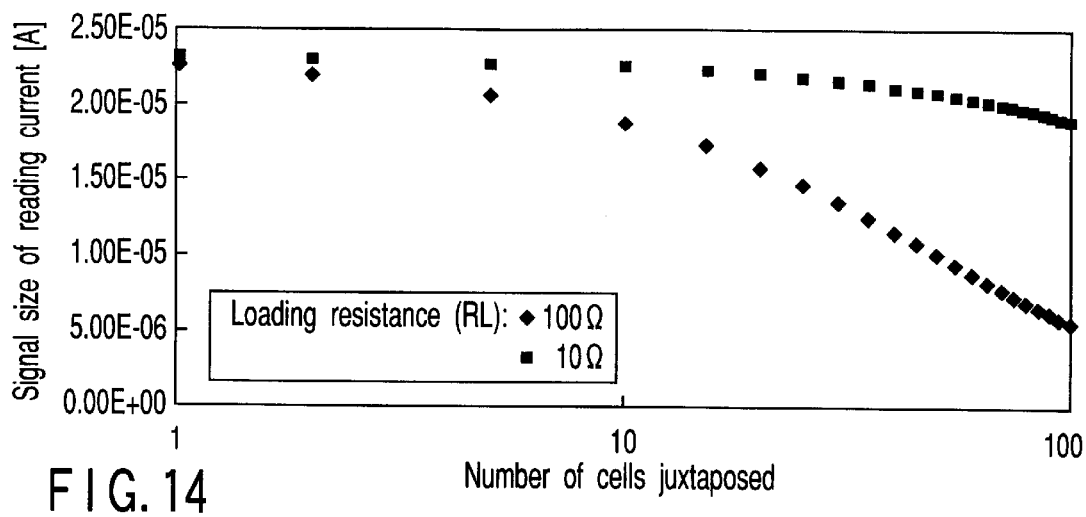
FIG. 14 is a graph illustrating the relationship between the number of juxtaposed cells and the variation of electric current.

FIG. 14 show the variation of electric current, respectively, which are obtained when the reading operation was performed under a condition where a plurality of TMR elements 25 are juxtaposed with each other. In this graph, the load resistance (RL=the resistance (Rt) of reading transistor 63 +series resistance (Rs)) was 10Ω or 100Ω.

When the number of TMR elements 25 being juxtaposed was increased, the total electric current passing through the circuit was proportionally increased. However, the absolute value of the variation of electric current ΔI to appear on the output side cannot be substantially minimized as shown in FIG. 14. Therefore, even if the number of TMR elements 25 being juxtaposed is increased up to several tens, no problem would be raised.

Incidentally, the number of TMR elements 25 to be juxtaposed can be further increased without problem by making the tunnel resistance of each of TMR elements 25 sufficiently higher than the load resistance RL.

According to the above first embodiment, the number of TMR elements 25 to be juxtaposed can be increased without prominently deteriorating the variation of electric current as shown in FIG. 14. Therefore, it is possible to increase the integration degree of the memory cells. As a result of this increase in integration degree of the memory cells, it becomes possible to produce a cell of practically employable level, even if a TMR element 25 exhibiting a low MR (Magneto Resistive) ratio is employed, or even if a TMR element 25 where the MR ratio or the resistance itself is greatly scattered is employed. Therefore, it is now possible to manufacture a MRAM memory cell wherein unit cells are arranged at a high density.

Further, according to the reading operation in this invention, the reading electric current that has been stored in the sense circuit 65 at the first cycle is compared with the reading electric current that has been stored in the sense circuit 65 at the third cycle as shown in FIG. 4. As a result of this comparison, if there is no substantial change in reading electric current between the first and third cycles, it is judged that the writing has been performed according to the expected value, whereas if there is a substantial difference in reading electric current between the first and third cycles, it is judged that the writing has been performed in a different manner from the expected value. According to this invention, it is possible in this manner to sufficiently secure a margin in the determination of the "1" and "0" data.

Second Embodiment

This second embodiment is featured in that the gate electrode of MISFET (MOSFET) is substituted for the word line employed in the aforementioned first embodiment. Incidentally, the constituent components and the principle of operation are the same as those of the first embodiment, and therefore, the explanation thereof will be omitted, and only the features which differ from the first embodiment will be explained.

Figure 15:
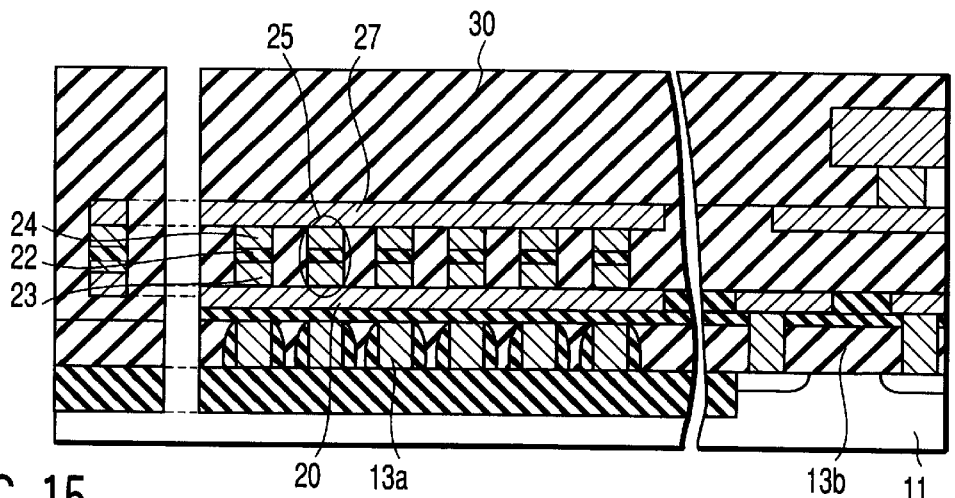
FIG. 15 is a cross-sectional view illustrating the semiconductor memory device according to a second embodiment of this invention.

FIG. 15 shows a cross-sectional view illustrating the semiconductor memory device according to the second embodiment of this invention. As shown in FIG. 15, the semiconductor memory device according to the second embodiment employs, as a memory element, a plurality of TMR elements 25 each constituted by a first magnetic body 23, a second magnetic body 24, and an insulating layer 22 which is formed of a non-magnetic body and sandwiched between the first and second magnetic bodies 23 and 24. Further, a plurality of TMR elements 25 are arranged parallel with each other. The first magnetic bodies 23 constituting these TMR elements 25 are connected with each other through a first wiring (lower data transfer line) 20, while the second magnetic bodies 24 constituting these TMR elements 25 are connected with each other through a second wiring (upper data transfer line) 27. Additionally, a third wiring (gate electrode) 13a is disposed over an extension line which connects a junction between the TMR elements 25 and the first wiring 20 with a junction between the TMR elements 25 and the second wiring 27. In this case, the first wiring 20 is disposed parallel with the second wiring 27, and these first and second wirings 20 and 27 are orthogonally intersected with the third wiring 13a. Further, these first and second wirings 20 and 27 and the plural TMR elements 25 are all arranged ladder-like.

Although not shown in FIG. 15, one of these first and second wirings 20 and 27 is connected with a constant voltage generating circuit, and the other is connected via a resistor with a grounded terminal, both ends of the resistor being connected with a sense circuit (see FIGS. 1 and 2). In this case, the constant voltage generating circuit and the grounded circuit should preferably be connected with the terminal portions of these first and second wirings 20 and 27, respectively. It would be possible in this manner to suppress the influence from the parasitic resistance of the wirings and hence to allow an electric current to uniformly flow throughout the memory cell array.

FIGS. 16 to 21 respectively shows a cross-sectional view illustrating a manufacturing step of the semiconductor memory device according to the second embodiment of this invention. Next, the method of manufacturing a semiconductor memory device according to this second embodiment will be explained.

Figure 16:
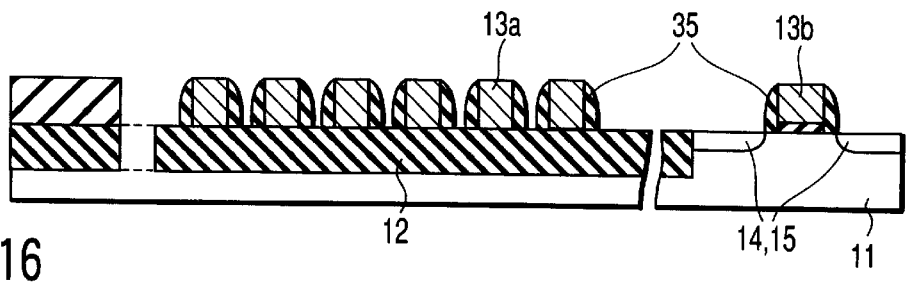
FIG. 16 is a cross-sectional view illustrating a manufacturing step of the semiconductor memory device according to a second embodiment of this invention.

First of all, as shown in FIG. 16, an oxide film (not shown) having a thickness of 30 to 40 angstroms for example and an SiN film (not shown) having a thickness of 2000 angstroms for example are successively deposited on a p-type silicon substrate 11. Then, by making use of lithography, a groove is formed in a memory cell region, and then, by means of LPCVD method, the groove is buried with an $SiO_2$ film. Then, by means of CMP method, the $SiO_2$ film is flattened to an element isolation region 12. Thereafter, by means of CVD method, a p-doped polysilicon film having a thickness of 750 angstroms for example is formed on the surfaces of the element isolation region 12 and of the silicon substrate 11. Then, a tungsten film having a thickness of 750 angstroms for example is formed on the surface of this polysilicon film by means of a sputtering method. Subsequently, an SiN film having a thickness of 500 to 1000 angstroms for example is formed on the surface of the tungsten film by means of CVD method. Additionally, a resist film (not shown) is formed on the surface of the SiN film. By making use of the gate electrode mask of (2-A) shown in FIG. 12, the resist film is etched to form a resist pattern. The resultant resist pattern is then employed as a mask for performing the patterning of the SiN film, the W film and the polysilicon film, thereby forming gate electrodes 13a and 13b. In this case, the gate electrode 13a functions as a wiring for generating a magnetic field of electric current for writing data in a memory cell, so that the gate electrode 13a is provided with a low resistance for allowing a large electric current to pass therethrough and with an electromigration resistance in the order of mA. Then, by means of CVD method, an SiN film having a thickness of about 100 angstroms for example is formed on the surfaces of the gate electrodes 13a and 13b, of the element isolation region 12 and of the silicon substrate 11. This SiN film is selectively etched by means of RIE to form an SiN spacer 35 on the sidewalls of the gate electrodes 13a and 13b. Then, an ion implantation is performed in a self-alignment manner to the SiN spacer 35 for forming the source/drain of the PMOS and NMOS, thus forming the source/drain regions 14 and 15, and hence, p-type or n-type MOSFET.

Figure 17:
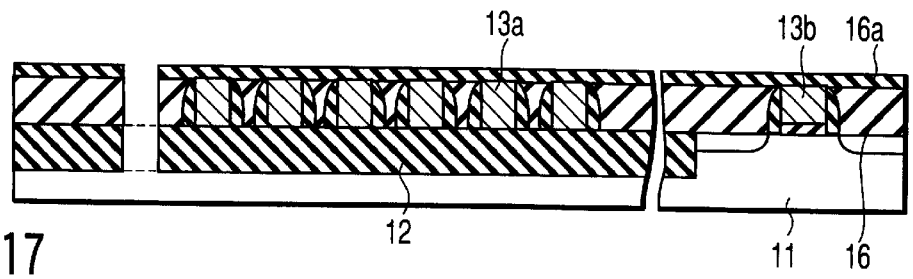
FIG. 17 is a cross-sectional view illustrating a manufacturing step of the semiconductor memory device subsequent to the step shown in FIG. 16 according to a second embodiment of this invention.

Then, as shown in FIG. 17, a first interlayer insulating film 16 is deposited on the surfaces of the gate electrodes 13a and 13b, of the element isolation region 12 and of the silicon substrate 11. Then, by using, as a stopper, the SiN film existing on the surface of the gate electrodes 13a and 13b, the first interlayer insulating film 16 is flattened by means of CMP method. Thereafter, an additional interlayer insulating film 16a having a thickness of several tens angstroms is formed on the surfaces of the first interlayer insulating film 16 and of the gate electrodes 13a and 13b. In this case, the distance between the data writing line and the memory cell is determined based not only on the thickness of the SiN film existing on the surface of the gate electrode 13abut also on the thickness of the additional interlayer insulating film 16a. Therefore, for the purpose of shorten this distance as much as possible and also for the purpose of suppressing the scattering of distance, the employment of the aforementioned process is preferable.

Then, as shown in FIG. 18, a first contact hole 17 is formed in the source/drain regions 14 and 15 formed in the peripheral circuit region. Then, an additional interlayer insulating film 16b is formed on the interlayer insulating film 16a. Thereafter, by making use of the lower data transfer line mask of (2-B) shown in FIG. 12, the additional interlayer insulating film 16b is etched down to a depth of about 2000 angstroms by means of RIE method, thereby forming a groove 18 for forming a lower data transfer line. Then, by means of MOCVD method, the groove 18 for forming a lower data transfer line and the first contact hole 17 are simultaneously buried with tungsten, the resultant tungsten layer being subsequently flattened. As a result, a contact 19 and a lower data transfer line 20 are concurrently formed. Further, by making use of sputtering method, a laminate film 21 for forming TMR elements is formed on the surface of the lower data transfer line 20.

In this case, the laminate film 21 for forming TMR elements is constructed such that an insulating layer 22 formed of an $Al_2O_3$ film having a thickness of 10 to 20 angstroms is employed as a tunnel barrier, and a first magnetic layer 23 and a second magnetic layer 24 are superimposed on the top and bottom sides of this insulating layer 22, respectively. The details on this TMR element are the same as those of the first embodiment, so that they are omitted herein. Next, by means of a CVD method, a DLC (Diamond-Like Carbon) film (not shown) is deposited on the laminate film 21 to be employed for forming TMR elements.

Then, as shown in FIG. 19, a resist film (not shown) is formed on the DLC film, and by making use of the TMR mask of (2-C) shown in FIG. 12, the resist film is etched to form a resist pattern. The resultant resist pattern is then employed for forming a DLC film pattern. Then, by making use of this DLC film pattern as a mask, the laminate film 21 for forming TMR elements is selectively etched by means of an ion milling method to form a laminate film pattern, thus forming a plurality of TMR elements over the gate electrode 13a.

Then, as shown in FIG. 20, a second interlayer insulating film 26 is deposited on the surfaces of the TMR elements and of the lower data transfer line 20. As a result, the regions between a plurality of TMR elements 25 are filled with this second interlayer insulating film 26. Subsequently, the second interlayer insulating film 26 is flattened by means of CMP method in such a manner that the second interlayer insulating film 26 having a thickness of about 2000 angstroms can be left remained on the TMR elements 25. Then, by making use of the upper data transfer line mask of (2-D) shown in FIG. 12, the second interlayer insulating film 26 is selectively etched to form a pattern thereof. As a result, a groove 27a for forming the upper data transfer line is formed, and the surfaces of the TMR elements 25 are exposed.

Figure 21:
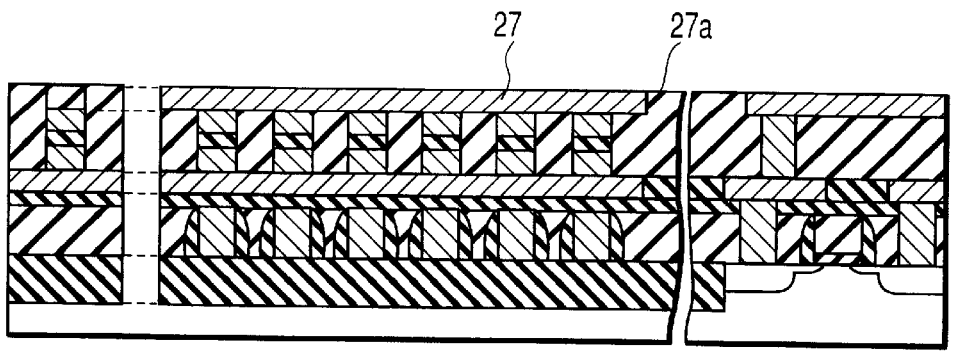
FIG. 21 is a cross-sectional view illustrating a manufacturing step of the semiconductor memory device subsequent to the step shown in FIG. 20 according to a second embodiment of this invention.

Then, as shown in FIG. 21, by means of sputtering method, a metal for forming an upper data transfer line is formed on the surfaces of the second interlayer insulating film 26 and of the TMR elements 25, thereby filling the upper data transfer line-forming groove 27a with the metal. Subsequently, the resultant metal layer is etched to form a pattern thereof, thus forming an upper data transfer line 27.

Then, as shown in FIG. 15, a third interlayer insulating film 30 is deposited on the surface of the upper data transfer line 27, the third interlayer insulating film 30 thus deposited being subsequently flattened by means of CMP method or resist etch-back method. Subsequently, by undergoing a multi-layer wiring process, a memory cell of MRAM is accomplished.

According to this second embodiment, the same effects as those of the first embodiment can be obtained.

Further, in place of the word line 29 shown in the first embodiment, the gate electrode 13a of MOSFET is formed also in the memory cell region. Therefore, since the gate electrode 13a of MOSFET in the memory cell region can be formed concurrent with the gate electrode 13b in the peripheral circuit region of cell, the number of manufacturing steps can be reduced as compared with the first embodiment. Additionally, the miniaturization of elements in the elevational direction can be promoted.

Third Embodiment

This second embodiment is featured in that the TMR elements of line-and-space configuration (linear) are formed on and along the lower data transfer line, and that the TMR elements are patterned in an island configuration by making use of a patterned upper data transfer line. Incidentally, the constituent components and the principle of operation are the same as those of the first embodiment, and therefore, the explanation thereof will be omitted, and only the features of manufacturing method which differ from the first embodiment will be explained.

Figure 22:
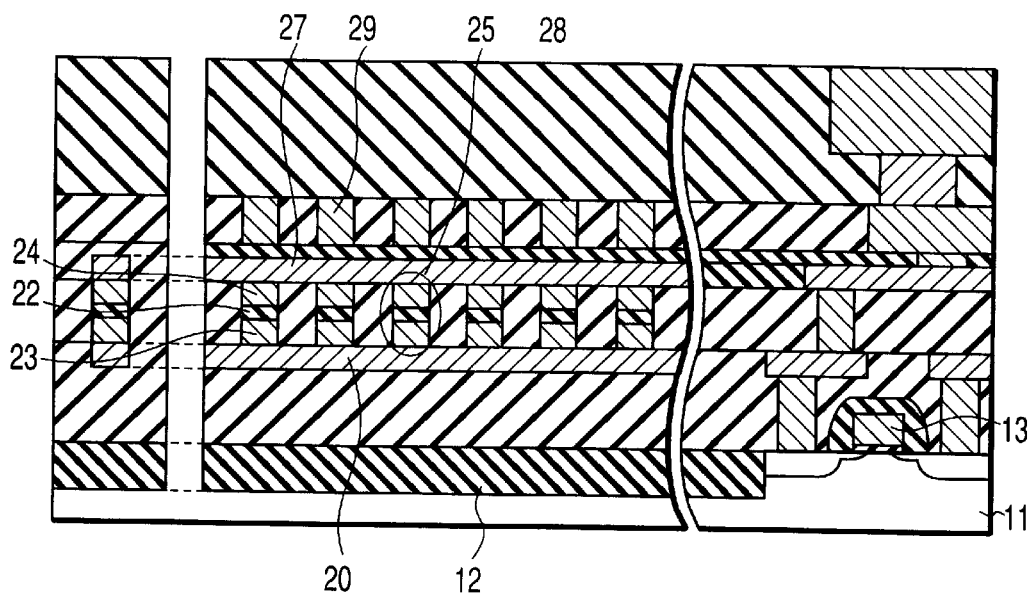
FIG. 22 is a cross-sectional view illustrating the semiconductor memory device according to a third embodiment of this invention.

FIG. 22 shows a cross-sectional view illustrating the semiconductor memory device according to the third embodiment of this invention. As shown in FIG. 22, the semiconductor memory device according to the third embodiment is the same in structure as that of the first embodiment, and therefore, the explanation thereof will be omitted.

FIGS. 23 to 29 respectively shows a cross-sectional view illustrating a manufacturing step of the semiconductor memory device according to the third embodiment of this invention. Next, the method of manufacturing a semiconductor memory device according to this third embodiment will be explained. Incidentally, the explanation on the processes which are similar to those of the first embodiment will be omitted.

Figure 23:
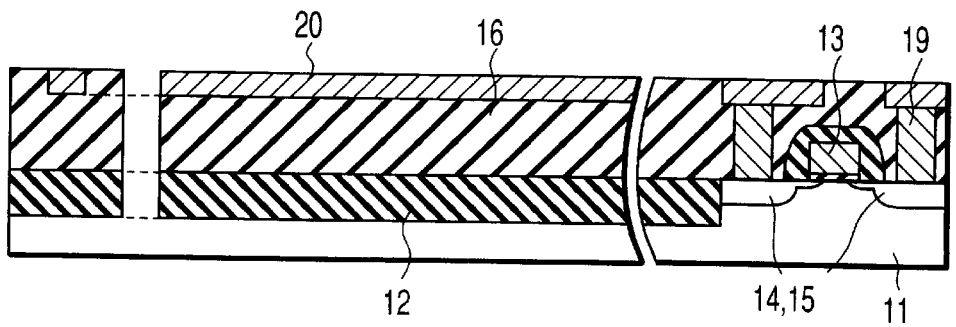
FIG. 23 is a cross-sectional view illustrating a manufacturing step of the semiconductor memory device according to a third embodiment of this invention.

First of all, as shown in FIG. 23, by making use of the lower data transfer line mask of (3-B) shown in FIG. 12, a lower data transfer line 20 is formed.

Figure 24:
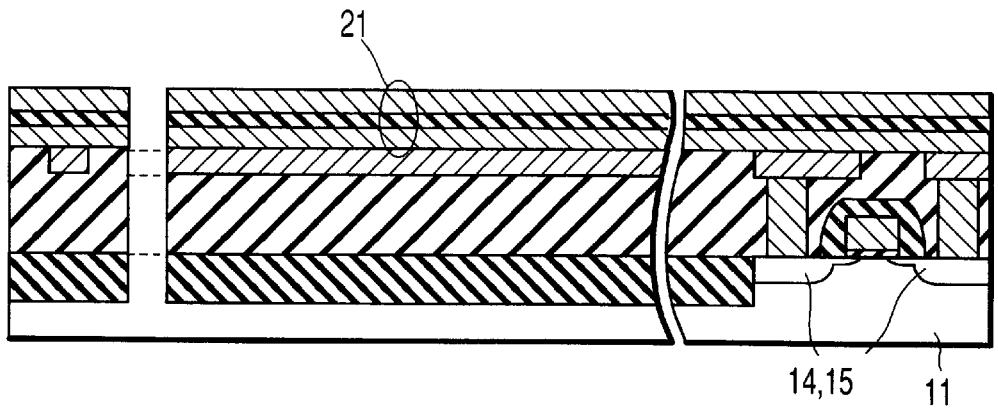
FIG. 24 is a cross-sectional view illustrating a manufacturing step of the semiconductor memory device subsequent to the step shown in FIG. 23 according to a third embodiment of this invention.

Then, as shown in FIG. 24, a laminate film 21 for forming TMR elements is formed on the surfaces of the lower data transfer line 20 and of the first interlayer insulating film 16. Thereafter, by means of a CVD method, a DLC film (not shown) is deposited on the laminate film 21 employed for forming TMR elements.

Figure 25:
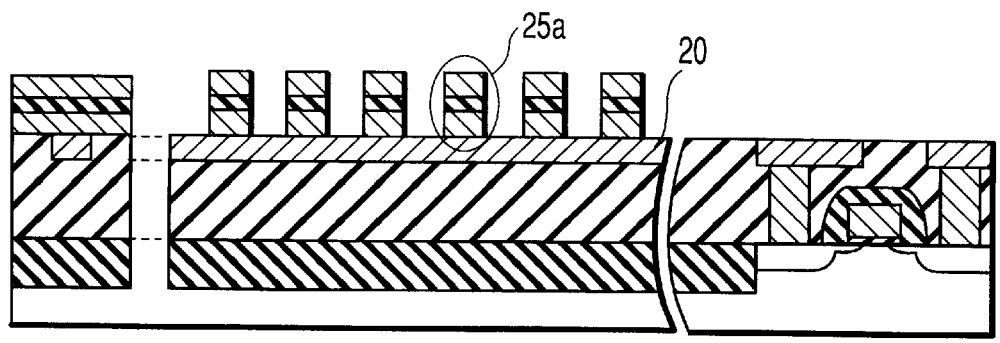
FIG. 25 is a cross-sectional view illustrating a manufacturing step of the semiconductor memory device subsequent to the step shown in FIG. 24 according to a third embodiment of this invention.

Then, as shown in FIG. 25, a resist film (not shown) is formed on the DLC film, and by making use of the TMR mask of (3-C) shown in FIG. 12, the resist film is etched to form a resist pattern. The resultant resist pattern is then employed for forming a DLC film pattern. Then, by making use of this DLC film pattern as a mask, the laminate film 21 for forming TMR elements is selectively etched by means of an ion milling method to form a laminate film pattern, thus forming a plurality of TMR elements 25a. In this case, the TMR elements 25a which have been patterned using the TMR mask of (3-C) shown in FIG. 12 are orthogonally intersected with the lower data transfer line 20 so as to form a line-and-space configuration.

Figure 26:
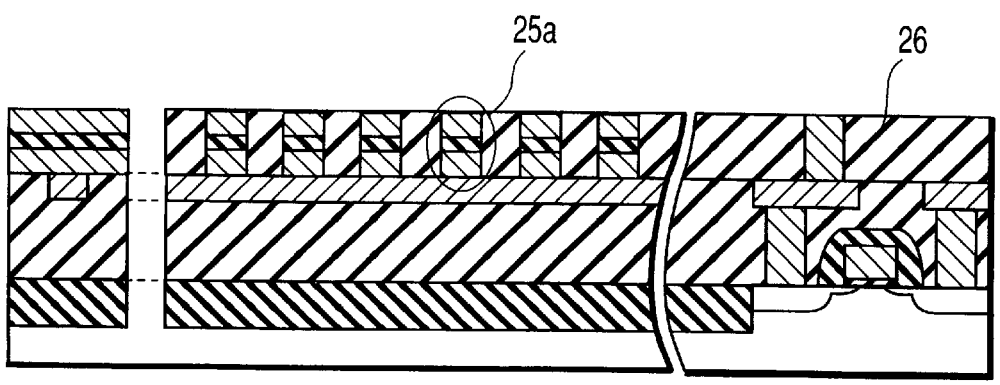
FIG. 26 is a cross-sectional view illustrating a manufacturing step of the semiconductor memory device subsequent to the step shown in FIG. 25 according to a third embodiment of this invention.

Then, as shown in FIG. 26, a second interlayer insulating film 26 is deposited on the surfaces of the TMR elements 25a and of the lower data transfer line 20, the second interlayer insulating film 26 thus deposited being subsequently flattened by means of CMP method until the surface of the TMR elements 25a is exposed. As a result, the regions between a plurality of TMR elements 25a are filled with this second interlayer insulating film 26.

Figure 27:
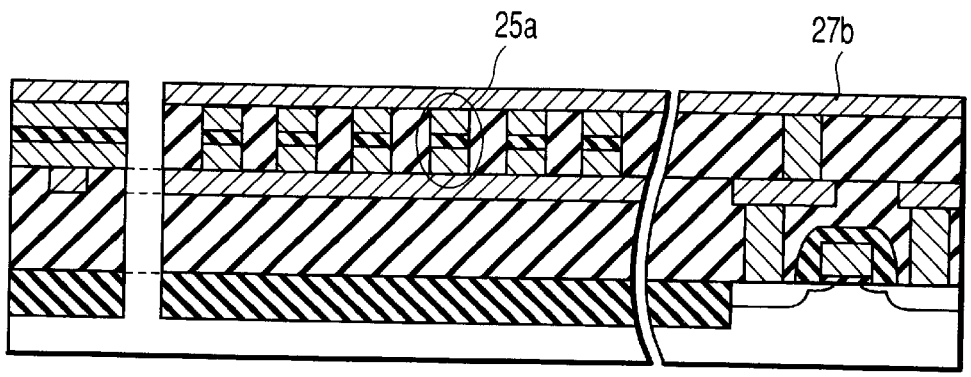
FIG. 27 is a cross-sectional view illustrating a manufacturing step of the semiconductor memory device subsequent to the step shown in FIG. 26 according to a third embodiment of this invention.

Then, as shown in FIG. 27, by means of sputtering method, a metal 27b for forming an upper data transfer line is formed on the surfaces of the second interlayer insulating film 26 and of the TMR elements 25a.

Figure 28:
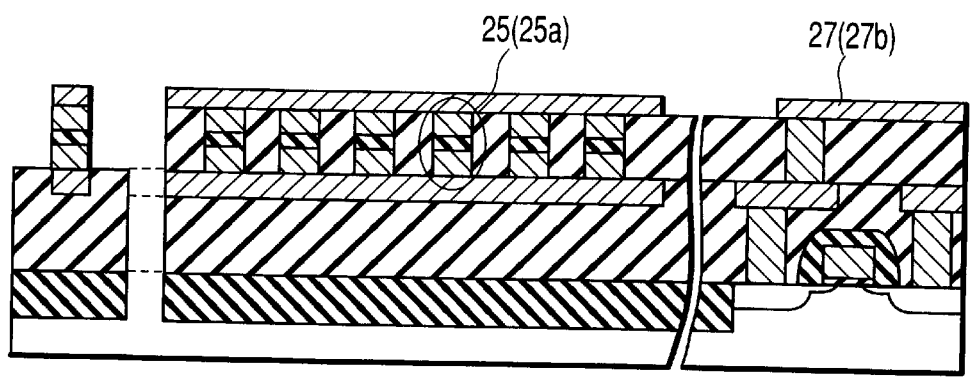
FIG. 28 is a cross-sectional view illustrating a manufacturing step of the semiconductor memory device subsequent to the step shown in FIG. 27 according to a third embodiment of this invention.

Subsequently, as shown in FIG. 28, by making use of the upper data transfer line mask of (3-D) shown in FIG. 12, the resultant metal layer 27a is etched to form a pattern thereof, thus forming an upper data transfer line 27. Then, by means of RIE method and by making use of the upper data transfer line 27 as a mask, a region where the surface of the line-and-space-like TMR elements 25a are exposed is etched away, thereby forming an island-shaped TMR elements 25.

Figure 29:
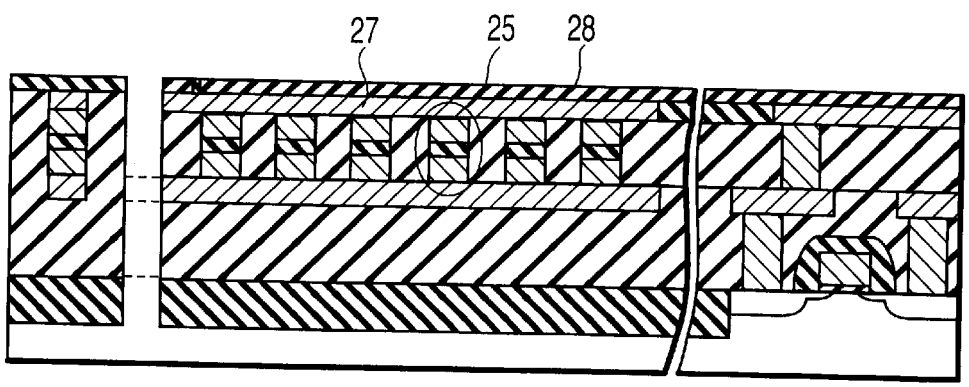
FIG. 29 is a cross-sectional view illustrating a manufacturing step of the semiconductor memory device subsequent to the step shown in FIG. 28 according to a third embodiment of this invention.

Then, as shown in FIG. 29, by means of CVD method, the gap portion formed between the TMR elements 25 is filled with $SiO_2$ film. Subsequently, by means of CMP method, the $SiO_2$ film is flattened until the surface of the upper data transfer line 27 is exposed. Then, a first dielectric film 28 having a thickness of several tens to several hundreds angstroms is formed on the surface of the upper data transfer line 27.

Then, as shown in FIG. 22, an Al—Cu film is deposited on the surface of this first dielectric film 28 by means of sputtering method. In this case, Al may be replaced by Al—Cu, Cu or W. Although there is not any particular limitation with respect to the thickness of the Al—Cu film, it is preferable to confine the thickness of the Al—Cu film to about 3000 angstroms or less so as to confine the aspect of the wiring to 3 or so, provided that the minimum design rule is of the generation of 0.1 $\mu$m. Next, a resist film (not shown) is formed on this Al—Cu film, and by making use of the word line mask of (3-E) shown in FIG. 12, the resist film is etched to form a pattern thereof. The resultant resist pattern is then employed for performing the patterning of the Al—Cu film, thus forming a plurality of word lines 29. Then, a third interlayer insulating film 30 is deposited on the surfaces of the word lines 29, the third interlayer insulating film 30 thus deposited being subsequently flattened by means of CMP method or resist etch-back method. Subsequently, by undergoing a multi-layer wiring process, a memory cell of MRAM can be accomplished.

According to this third embodiment, the same effects as those of the first embodiment can be obtained.

Further, according to this third embodiment, the TMR elements of line-and-space configuration (linear) are formed on and along the lower data transfer line 20, and subsequently, the TMR elements are patterned in an island configuration by making use of a patterned upper data transfer line. As a result, since the lower data transfer line 20 and the TMR elements 25a are orthogonally intersected with each other forming a line-and-space configuration at the moment when the laminate film 21 for TMR elements has been patterned, the junction portion between them can be aligned in a self-alignment manner irrespective of any miss-matching between them. Further, since the TMR elements 25a of line-and-space configuration can be patterned in a self-alignment manner due to the existence of the upper data transfer line 27 in the formation of island-shaped TMR elements 25, the junction portion between the TMR elements 25 and the upper data transfer line 27 can be aligned in a self-alignment manner irrespective of any miss-matching between them. Therefore, it is possible according to this third embodiment to enlarge the process margin.

Fourth Embodiment

This fourth embodiment is featured in that a cell of two bits is superimposed respectively on the top and bottom surfaces of the word line, thereby enabling this word line to be utilized in common by two cells. Incidentally, since the constituent components and the principle of operation in this fourth embodiment are the same as those of the first embodiment, the explanation thereof will be omitted, and only the features of structure and manufacturing method which differ from the first embodiment will be explained.

FIG. 30A shows a cross-sectional view illustrating the semiconductor memory device according to the fourth embodiment of this invention. As shown in FIG. 30A, the semiconductor memory device according to the fourth embodiment employs, as a memory element, a plurality of TMR elements 25 and 43 each constituted by a first magnetic body 23, a second magnetic body 24, and an insulating layer 22 which is formed of a non-magnetic body and sandwiched between the first and second magnetic bodies 23 and 24. Further, a plurality of first TMR elements 25 are arranged parallel with each other. The first magnetic bodies 23 constituting these first TMR elements 25 are connected with each other through a first wiring (a first lower data transfer line) 20, while the second magnetic bodies 24 constituting these first TMR elements 25 are connected with each other through a second wiring (a first upper data transfer line) 29. Additionally, a third wiring (word line) 29 is disposed over an extension line which connects a junction between the first TMR elements 25 and the first wiring 20 with a junction between the first TMR elements 25 and the second wiring 27. On the other hand, on one side of this third wiring 29, which is opposite to the side where a plurality of the first TMR elements 25 are located, there are positioned a plurality of second TMR elements 43 which are arrayed parallel with each other. The first magnetic bodies 23 constituting these second TMR elements 43 are connected with each other through a fourth wiring (a second lower data transfer line) 42, while the second magnetic bodies 24 constituting these second TMR elements 43 are connected with each other through a fifth wiring (a second upper data transfer line) 45.

In this manner, the first TMR elements 25 and the first and second wirings 20 and 27 are all linearly symmetrical to the second TMR elements 43 and the fourth and fifth wirings 42 and 45 with respect to an axis constituted by the third wiring 29.

In this case, the first wiring 20, the second wiring 27, the fourth wiring 42 and the fifth wiring 45 are all formed parallel with each other, but are all orthogonally intersected with the third wiring 29. Furthermore, the third wiring 29 is disposed on and along an extension line which connects a junction between the second TMR elements 43 and the fourth wiring 42 with a junction between the second TMR elements 43 and the fifth wiring 45. On the other hand, these first and second wirings 20 and 27 and the first TMR elements 25 are all arranged ladder-like. Likewise, these fourth and fifth wirings 42 and 45 and the second TMR elements 43 are all arranged ladder-like.

Next, the method of manufacturing a semiconductor memory device according to this fourth embodiment will be explained. Incidentally, the explanation on the processes which are similar to those of the first embodiment will be omitted, and only the processes which differ from those of the first embodiment will be explained.

As shown in FIG. 30A, a word line 29 is formed in the same manner as described in the first embodiment. Then, a third interlayer insulating film 30 is formed on the surfaces of the first dielectric film 28 and of the word line 29, and then, flattened until the surface of the word line 29 is exposed. Then, a second dielectric film 41 having a thickness of several tens to several hundreds angstroms is formed on the surfaces of the word line 29 and of the third interlayer insulating film 30. Thereafter, in the same procedures employed for forming the first lower data transfer line 20, the first TMR element 25, the second interlayer insulating film 26 and the first upper data transfer line 27, the depositions of the second lower data transfer line 42, the second TMR element 43, the fourth interlayer insulating film 44 and the second upper data transfer line 45 are successively performed. Then, a fifth interlayer insulating film 46 is deposited on the surface of the second upper data transfer line 45, and then, flattened by means of CMP method or resist etch-back method. Subsequently, by undergoing a multi-layer wiring process, a memory cell of MRAM can be accomplished.

Figure 30B:
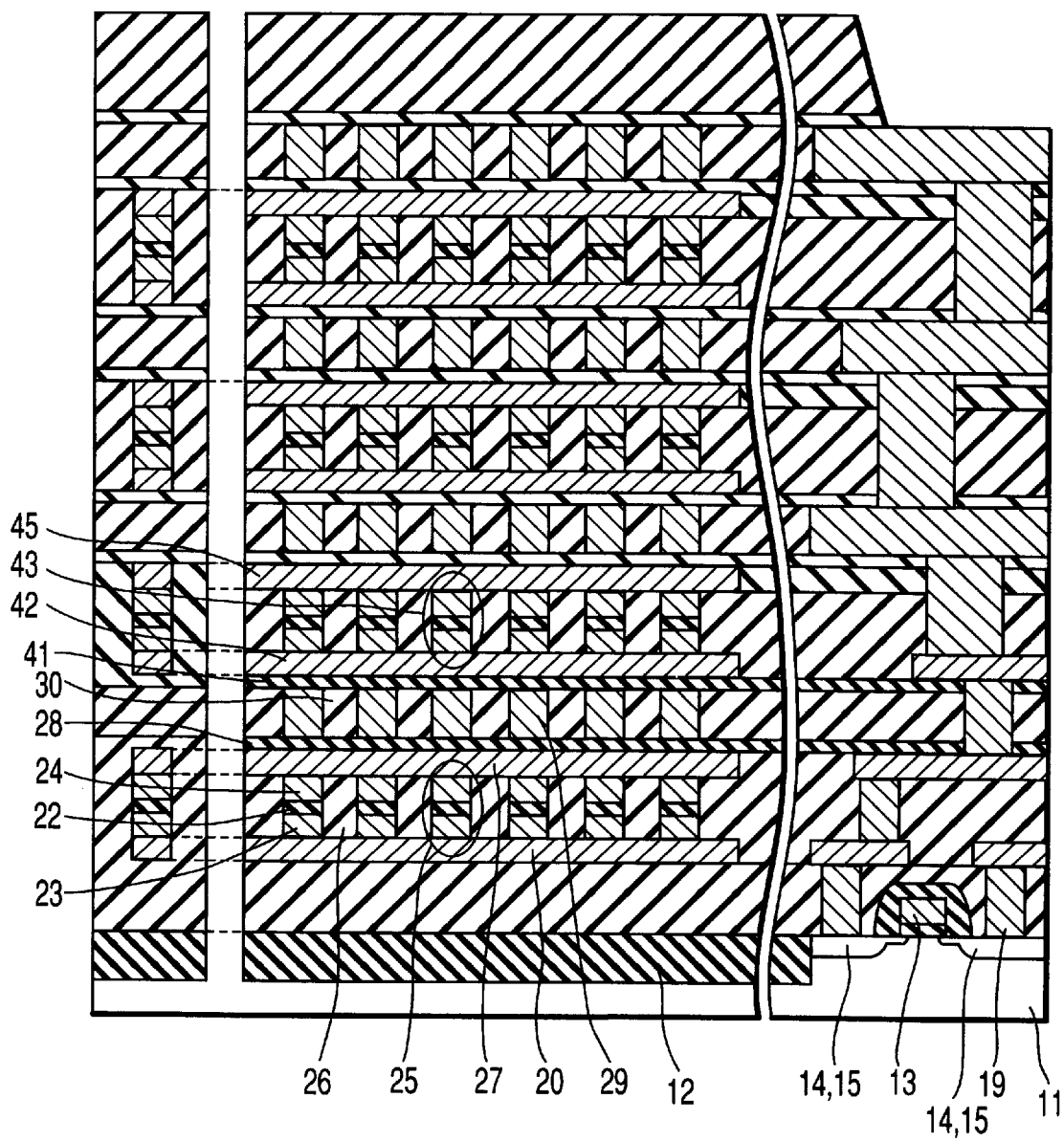
FIG. 30B is a cross-sectional view illustrating the semiconductor memory device of a multiple structure according to a fourth embodiment of this invention.

Incidentally, it is also possible, through a repetition of the aforementioned processes, to obtain a MRAM memory cell of a multiple structure. For example, a MRAM memory cell of a multiple structure as shown in FIG. 30B can be fabricated.

According to this fourth embodiment, the same effects as those of the first embodiment can be obtained.

When the memory cell is constructed according to this fourth embodiment, t he writing operation to the first TMR elements 25 for example can be performed in such a manner that through the selection of the word line 29 and of the first lower data transfer line 20, the cell located at the cross point between them can be selected. Likewise, through the selection of the word line 29 and of the second upper data transfer line 45, the second TMR element 43 located just over them can be selected.

Likewise, the reading operation can be performed by separately selecting these first and second TMR elements 25 and 43 located above and below. As explained above, since cells of two bits are superimposed respectively on the top and bottom surfaces of the word line, thereby enabling this word line to be utilized in common by a couple of cells, the effective area per unit cell can be further minimized.

Fifth Embodiment

This fifth embodiment is featured in that cells of two bits are superimposed respectively on the top and bottom surfaces of the second data transfer line, thereby enabling this second data transfer line to be utilized in common by a couple of cells. Incidentally, since the constituent components and the principle of operation in this fifth embodiment are the same as those of the first and second embodiments, the explanation thereof will be omitted, and only the features of structure and manufacturing method which differ from the first and second embodiments will be explained.

FIG. 31 shows a cross-sectional view illustrating the semiconductor memory device according to the fifth embodiment of this invention. As shown in FIG. 31, the semiconductor memory device according to the fifth embodiment employs, as a memory element, a plurality of TMR elements 25 and 51 each constituted by a first magnetic body 23, a second magnetic body 24, and an insulating layer 22 which is formed of a non-magnetic body and sandwiched between the first and second magnetic bodies 23 and 24. Further, a plurality of first TMR elements 25 are arranged in parallel with each other. The first magnetic bodies 23 constituting these first TMR elements 25 are connected with each other through a first wiring (a first lower data transfer line) 20, while the second magnetic bodies 24 constituting these first TMR elements 25 are connected with each other through one side of a second wiring (a second data transfer line) 27. On the other hand, the first magnetic bodies 23 constituting these second TMR elements 51 which are juxtaposed with each other are connected with each other through the other side of the second wiring 27. Further, the second magnetic bodies 24 constituting these first TMR elements 51 are connected with each other through a third wiring (third data transfer line) 53. On one side of the first wiring 20, which is opposite to the side where a plurality of the first TMR elements 25 are located, there are positioned a plurality of fourth wirings (gate electrodes) 13a which are disposed on and along an extension line connecting a junction between the first TMR elements 25 and the first wiring 20 with a junction between the first TMR elements 25 and the second wiring 27.

Further, on one side of the third wiring 53, which is opposite to the side where a plurality of the second TMR elements 51 are located, there are positioned a plurality of fifth wirings (word lines) 55 which are disposed on and along an extension line connecting a junction between the second TMR elements 51 and the second wiring 27 with a junction between the second TMR elements 51 and the third wiring 53.

In this manner, the first TMR elements 25 and the first and fourth wirings 20 and 13a are all linearly symmetrical to the second TMR elements 51 and the third and fifth wirings 53 and 55 with respect to an axis constituted by the second wiring 27.

In this case, the first wiring 20, the second wiring 27 and the third wiring 53 are all formed parallel with each other, but are all orthogonally intersected with the fourth and fifth wirings 13a and 55.

Furthermore, these first and second wirings 20 and 27 and the first TMR elements 25 are all arranged ladder-like. Likewise, these second and third wirings 27 and 53 and the second TMR elements 51 are all arranged ladder-like.

Next, the method of manufacturing a semiconductor memory device according to this fifth embodiment will be explained. Incidentally, the explanation of the processes which are similar to those of the second embodiment will be omitted, and only the processes which differ from those of the second embodiment will be explained.

As shown in FIG. 31, a second data transfer line 27 is formed in the same manner as described in the second embodiment. Then, in the same manner as employed for forming the first TMR elements 25, the second TMR elements 51 are formed by making use of the TMR mask of (2-C) shown in FIG. 12.

Then, the gap portion formed between the TMR elements 51 is filled with the third interlayer insulating film 52. Subsequently, by means of sputtering method, a metal for forming an upper data transfer line is formed on the surfaces of the second TMR elements 51 and of the third interlayer insulating film 52. Then, by making use of the third data transfer line mask of (2-D) shown in FIG. 12, the metal for forming a third upper data transfer line is turned into a pattern, thus forming a third data transfer line 53.

Subsequently, a second dielectric film 54 having a thickness of several tens to several hundreds angstroms is formed on the surface of the third data transfer line 53.

Then, an Al—Cu film is deposited on the surface of this second dielectric film 54 by means of sputtering method. In this case, Al may be replaced by Al—Cu, Cu or W. Although there is not any particular limitation with respect to the thickness of the Al—Cu film, it is preferable to confine the thickness of the Al—Cu film to about 3000 angstroms or less so as to confine the aspect of the wiring to 3 or so, provided that the minimum design rule is of the generation of 0.1 μm. Next, a resist film (not shown) is formed on this Al—Cu film, and by making use of the mask of (2-A) shown in FIG. 12, the resist film is etched to form a pattern thereof. The resultant resist pattern is then employed for performing the patterning of the Al—Cu film, thus forming a plurality of word lines 55. Then, a fourth interlayer insulating film 56 is deposited on the surfaces of the word lines 55, the fourth interlayer insulating film 56 thus deposited being subsequently flattened by means of CMP method or resist etchback method. Subsequently, by undergoing a multi-layer wiring process, a memory cell of MRAM can be accomplished.

According to this fifth embodiment, the same effects as those of the first embodiment can be obtained.

When the memory cell is constructed according to this fifth embodiment, the writing operation to the first TMR elements 25 for example can be performed in such a manner that through the selection of the gate electrode 13a and of the second data transfer line 27, the cell located at the cross point between them can be selected. Likewise, through the selection of the word line 55 and of the second data transfer line 27, the second TMR element 51 located just over them can be selected.

Likewise, the reading operation can be performed by separately selecting these upper and lower TMR elements 25 and 51. As explained above, since cells of two bits are superimposed respectively on the top and bottom surfaces of the second data transfer line 27, thereby enabling this second data transfer line 27 to be utilized in common by a couple of cells, the effective area per unit cell can be further minimized.

Sixth Embodiment

This sixth embodiment illustrates one example wherein the film thickness of the upper data transfer line to be selected on the occasion of reading is made thinner than the film thickness of the lower data transfer line to be selected on the occasion of writing. Incidentally, since the constituent components and the principle of operation in this sixth embodiment are the same as those of the first embodiment, the explanation thereof will be omitted, and only the features of structure and manufacturing method which differ from the first embodiment will be explained.

Figure 32:
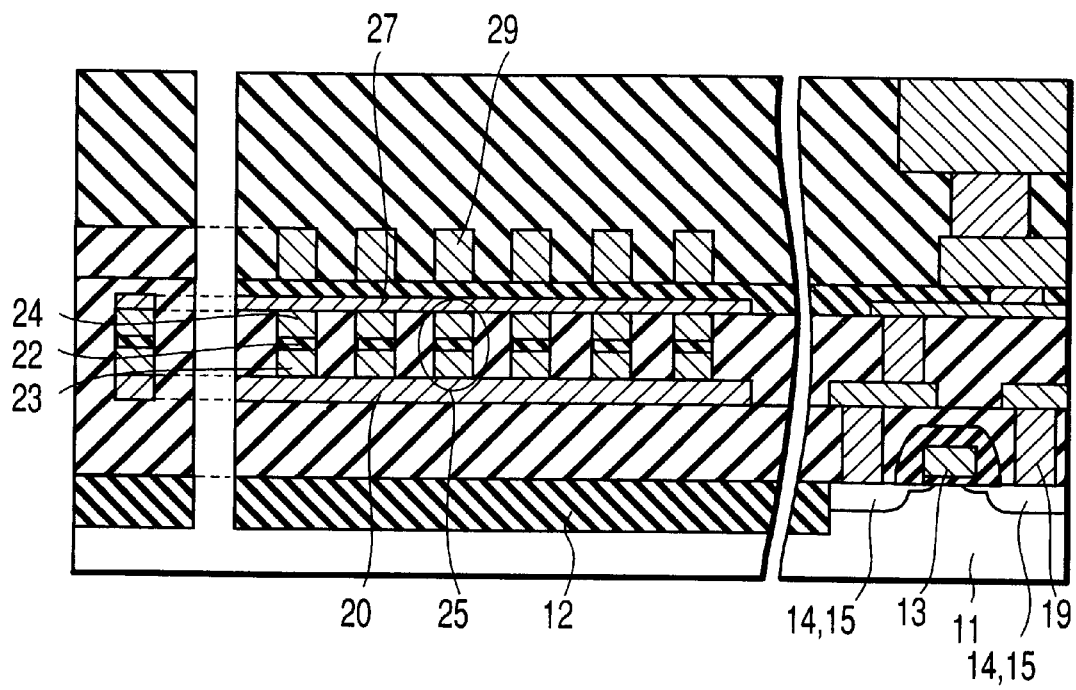
FIG. 32 is a cross-sectional view illustrating the semiconductor memory device according to a sixth embodiment of this invention.

FIG. 32 shows a cross-sectional view illustrating the semiconductor memory device according to the sixth embodiment of this invention. As shown in FIG. 32, the semiconductor memory device according to the sixth embodiment is featured in that the film thickness of the upper data transfer line 27 is made substantially thinner than the film thickness of the lower data transfer line 20, and that other constituent components are the same as those of the first embodiment. As a result, the distance between the word line 29 and the TMR elements 25 is shortened.

According to this sixth embodiment, the same effects as those of the first embodiment can be obtained.

Further, since the film thickness of the upper data transfer line 27 to be selected on the occasion of reading is made thinner than the film thickness of the lower data transfer line 20 to be selected on the occasion of writing, the distance between the word line 29 and the TMR elements 25 can be shortened. Therefore, it is now possible, on the occasion of writing by making use of both of the lower data transfer line 20 and the word line 29, to minimize the electric current required for generating a magnetic field on the occasion of generating a writing magnetic field, thereby making it possible to further enlarge the operational margin.

Moreover, when two to several composites each constituting the structure of this sixth embodiment and consisting of the word line 29, the upper data transfer line 21, the TMR elements 25 and the lower data transfer line 20 are laminated one upon another, the effective area per unit cell can be further minimized.

Seventh Embodiment

This seventh embodiment illustrates one example wherein the film thickness of the lower data transfer line to be selected on the occasion of reading is made thinner than the film thickness of the upper data transfer line to be selected on the occasion of writing. Incidentally, since the constituent components and the principle of operation in this seventh embodiment are the same as those of the first and second embodiments, the explanation thereof will be omitted, and only the features of structure and manufacturing method which differ from the first and second embodiments will be explained.

Figure 33:
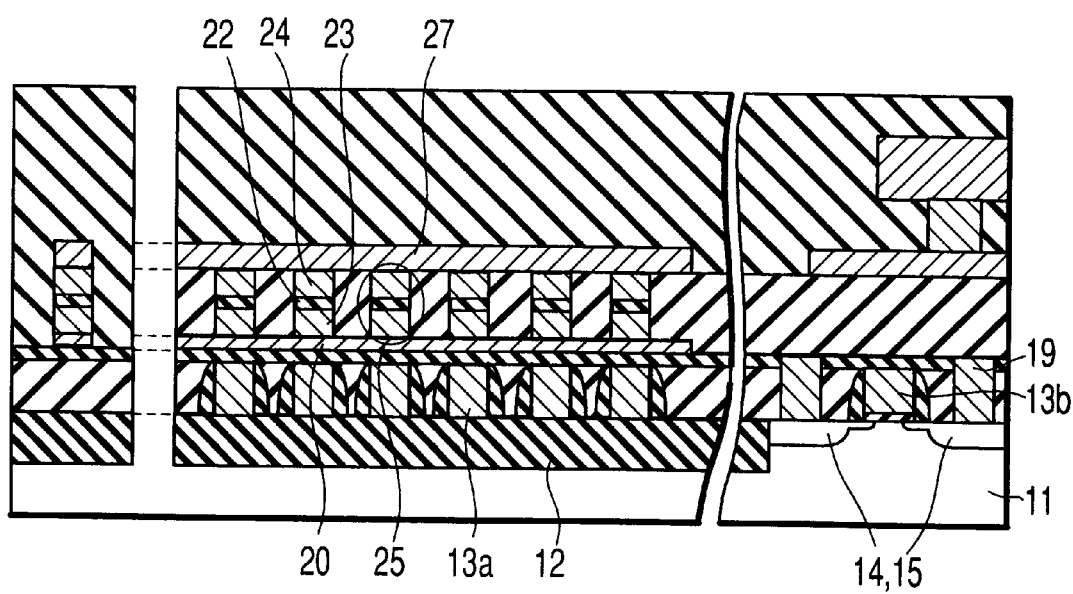
FIG. 33 is a cross-sectional view illustrating the semiconductor memory device according to a seventh embodiment of this invention.
Figure 34:
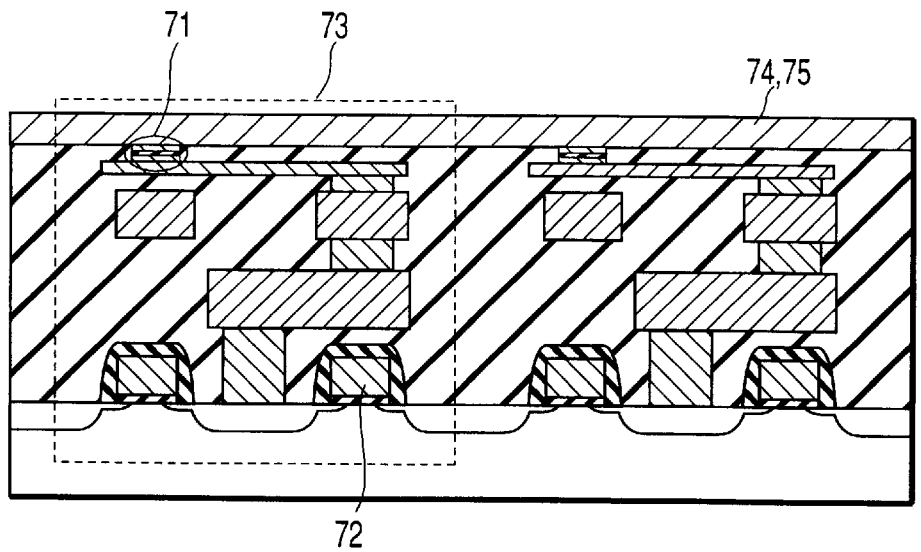
FIG. 34 is a cross-sectional view illustrating the semiconductor memory device according to the prior art.
Figure 35:
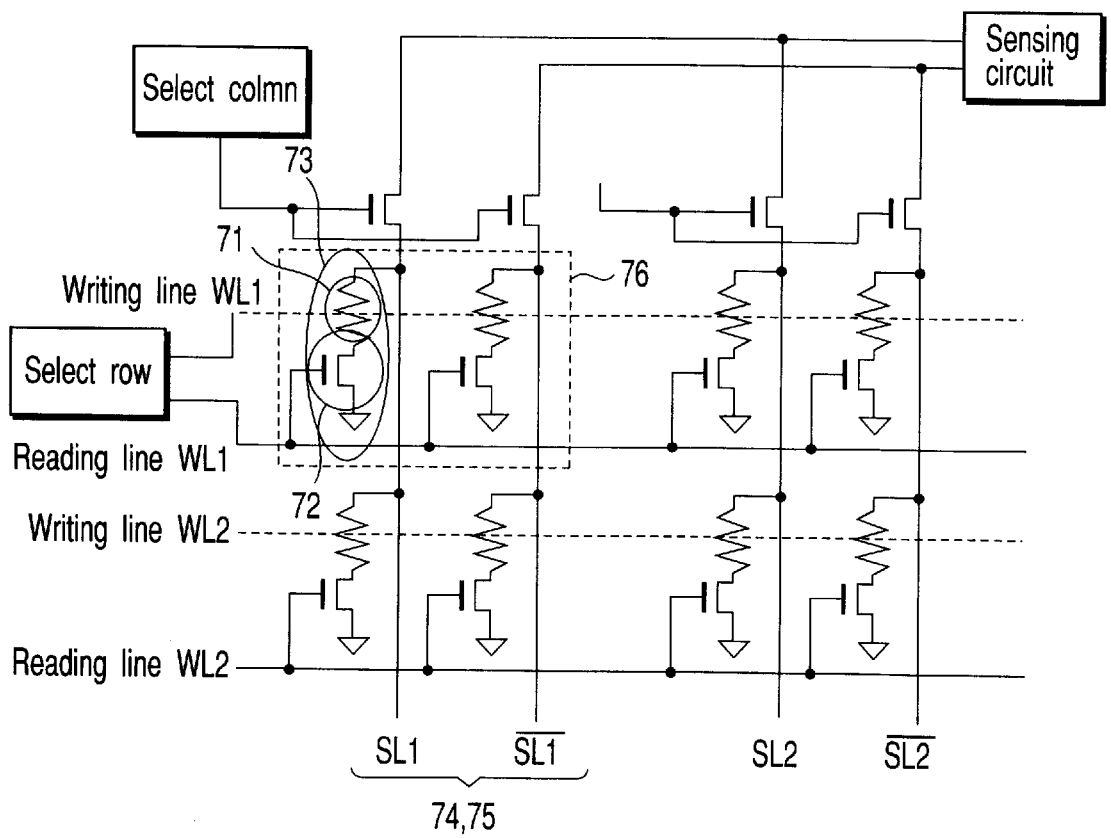
FIG. 35 is an equivalent circuit of the semiconductor memory device according to the prior art.

FIG. 33 shows a cross-sectional view illustrating the semiconductor memory device according to the seventh embodiment of this invention. As shown in FIG. 33, the semiconductor memory device according to the seventh embodiment is featured in that the film thickness of the lower data transfer line 20 is made substantially thinner than the film thickness of the upper data transfer line 27, and that other constituent components are the same as those of the second embodiment. As a result, the distance between the gate electrodes 13a and the TMR elements 25 is shortened.

According to this seventh embodiment, the same effects as those of the first embodiment can be obtained.

Further, since the film thickness of the lower data transfer line 20 to be selected on the occasion of reading is made thinner than the film thickness of the upper data transfer line 27 to be selected on the occasion of writing, the distance between the gate electrodes 13a and the TMR elements 25 can be shortened. Therefore, it is now possible, on the occasion of writing by making use of both of the upper data transfer line 27 and the gate electrodes 13a, to minimize the electric current required for generating a magnetic field on the occasion of generating a writing magnetic field, thereby making it possible to further enlarge the operational margin.

Moreover, when two to several composites each constituting the structure of this seventh embodiment and consisting of the upper data transfer line 27, the TMR elements 25, the lower data transfer line 20 and the gate electrodes 13a are laminated one upon another, the effective area per unit cell can be further minimized.

Additional advantages and modifications will readily occur to those skilled in the art. Therefore, the invention is its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:

first memory elements to store a first state or a second state according to a change in resistance value, each of said first memory elements comprising one terminal and an other terminal, said first memory elements arranged parallel with each other;

a first wiring connected with said one terminal of each of said first memory elements;

a second wiring formed in parallel with said first wiring and connected with said other terminal of each of said first memory elements; and a third wiring disposed opposite said first memory elements with said first wiring being interposed therebetween, said third wiring arranged in a first direction and said first and second wirings arranged in a second direction different from said first direction, said third wiring electrically insulated from said first and second wirings, thereby enabling said first state or said second state to be written into one of selected from said first memory elements through said third wiring and one of said first and second wirings, said third wiring forming a gate electrode of MISFET, wherein said first state or said second state stored in one of selected from said first memory elements is read out by delivering an electric current from one of said first and second wirings via said one of selected from said first memory elements to the other of said first and second wirings.

2. The semiconductor memory device according to claim 1, wherein said third wiring passing over an extension line connecting a junction between said first memory elements and said first wiring with a junction between said first memory elements and said second wiring.

3. The semiconductor memory device according to claim 1, wherein said first and second directions cross each other.

4. The semiconductor memory device according to claim 1, which further comprises:

second memory elements disposed opposite said first memory elements with said third wiring being interposed therebetween, said second memory elements to store a first state or a second state according to a change in resistance value, each of said second memory elements comprising one terminal and the other terminal, said second memory elements arranged parallel with each other;

a fourth wiring formed in parallel with said first and second wirings and connected with said one terminal of each of said second memory elements, said fourth wiring electrically insulated from said third wiring; and a fifth wiring formed in parallel with said first and second wirings and connected with said other terminal of each of said second memory elements.

5. A semiconductor memory device comprising:

first memory elements to store a first state or a second state according to a change in resistance value, each of said first memory elements comprising one terminal and an other terminal, said first memory elements arranged parallel with each other;

a first wiring connected with said one terminal of each of said first memory elements;

a second wiring formed in parallel with said first wiring and connected with said other terminal of each of said first memory elements;

a third wiring disposed opposite said first memory elements with said first or second wirings being interposed therebetween, said third wiring arranged in a first direction and said first and second wirings arranged in a second direction different from said first direction, said third wiring electrically insulated from said first and second wirings, thereby enabling said first state or said second state to be written into one of selected from said first memory elements through said third wiring and one of said first and second wirings;

second memory elements disposed opposite said first memory elements with said third wiring being interposed therebetween, said second memory elements to store a first state or a second state according to a change in resistance value, each of said second memory elements comprising one terminal and the other terminal, said second memory elements arranged parallel with each other;

a fourth wiring formed in parallel with said first and second wirings and connected with said one terminal of each of said second memory elements, said fourth wiring electrically insulated from said third wiring; and a fifth wiring formed in parallel with said first and second wirings and connected with said other terminal of each of said second memory elements, wherein said first state or said second state stored in one of selected from said first memory elements is read out by delivering an electric current from one of said first and second wirings via said one of selected from said first memory elements to the other of said first and second wirings.

* * * * *